US005600172A

United States Patent [19]
McDevitt et al.

[11] Patent Number: 5,600,172
[45] Date of Patent: Feb. 4, 1997

[54] HYBRID, DYE ANTENNA/THIN FILM SUPERCONDUCTOR DEVICES AND METHODS OF TUNED PHOTO-RESPONSIVE CONTROL THEREOF

[75] Inventors: John T. McDevitt; David C. Jurbergs, both of Austin, Tex.

[73] Assignee: Electric Power Research Institute, Palo Alto, Calif.

[21] Appl. No.: 334,786

[22] Filed: Nov. 3, 1994

Related U.S. Application Data

[63] Continuation-in-part of Ser. No. 40,799, Mar. 31, 1993, abandoned.

[51] Int. Cl.$^6$ ........................ H01L 31/0232; G02F 1/01; G02B 5/22; H01B 12/00
[52] U.S. Cl. ........................ 257/436; 257/440; 257/35; 505/237; 359/240; 359/886; 359/891
[58] Field of Search ........................ 257/435, 436, 257/439, 440, 34, 35; 359/885, 886, 891; 252/589; 505/181, 182, 183, 233, 701, 702, 848, 849

[56] References Cited

U.S. PATENT DOCUMENTS

| | | | |
|---|---|---|---|
| 3,956,727 | 5/1976 | Wolf | 505/862 |
| 4,367,369 | 1/1983 | Mizutani et al. | 257/40 |
| 4,521,682 | 6/1985 | Murakami et al. | 257/35 |
| 4,578,691 | 3/1986 | Murakami et al. | 257/36 |
| 4,700,080 | 10/1987 | Fukaya et al. | 359/891 |
| 4,869,598 | 9/1989 | McDonald | 505/847 |
| 5,019,721 | 5/1991 | Martens et al. | 257/34 |
| 5,021,658 | 6/1991 | Bluzer | 505/849 |
| 5,057,485 | 10/1991 | Nishino et al. | 505/160 |
| 5,110,792 | 5/1992 | Nakayama et al. | 359/240 |
| 5,291,055 | 3/1994 | Farhoomand et al. | 257/436 |

FOREIGN PATENT DOCUMENTS

| | | | |
|---|---|---|---|
| 64-1139 | 1/1989 | Japan | 257/435 |

OTHER PUBLICATIONS

Zhao, Jianai, Jurbergs, David, Yamazi, Brett, and McDevitt, John T., "Optical Devices Based On Dye–Coated Superconductor Junctions: An Example of a Composite Molecule—Superconductor Device," Journal of the American Chemical Society, 1992, 114.

Dagani, Ron, "Color–specific Light Detector Demonstrated," C & EN, Apr. 13, 1992, p. 6.

Amato, Ivan, "Chemists Storm San Francisco," Science, vol. 256, Apr. 24, 1992, pp. 442–443.

*Primary Examiner*—Mahshid Saadat
*Attorney, Agent, or Firm*—Oblon, Spivak, McClelland, Maier & Neustadt P.C.

[57] ABSTRACT

A surface of a thin film superconductor element is coated with a layer containing pre-selected dye, or multiple dyes, alone or in combination with intermediate reflective coatings (best mode), which, when maintained near $T_c$, upon exposure to a selected frequency of light acts as a narrow bandwidth absorber to change the resistive property of the underlying superconductor following energy transfer from the dye to the superconductor. The resistance change is electronically detectable to function as a wavelength selective high speed optoelectronic switch or sensor element. A plurality of elements can be arrayed with each element junction being sensitized by overcoating with a different dye layer, either alone or in combination with an underlying reflective coating, so that upon exposure to a broad spectrum or polychromic light source, the individual junctions will independently be switched or not depending on the wavelength to which the superconductor junction is tuned by the pre-selected dye, thereby permitting multiplexed photo-optical message transmission and detection. For example, a single optical fiber may carry several signals simultaneously, each of which is encoded in a different color (λ) and transmitted as a polychromic beam. The array distinguishes between signals as each detector is tuned to a selected encoded light color.

20 Claims, 13 Drawing Sheets

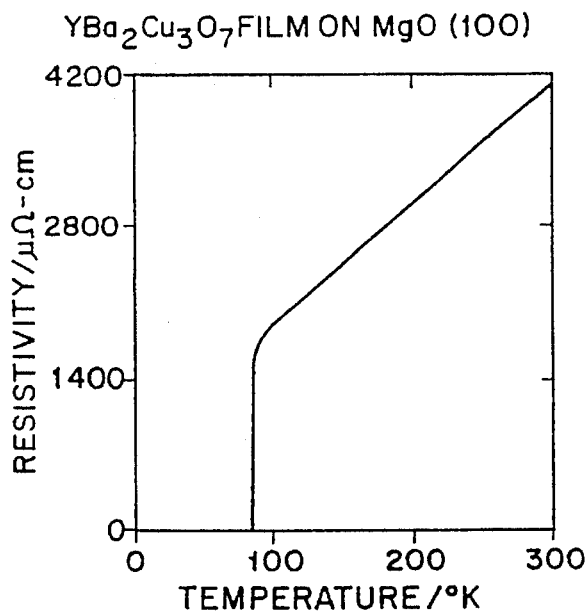
Fig_2
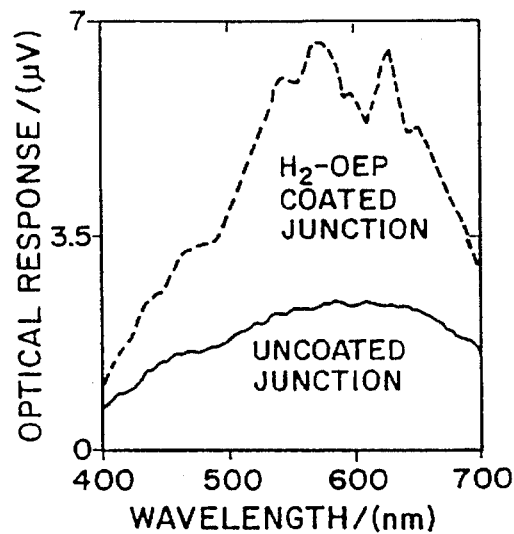
Fig_5
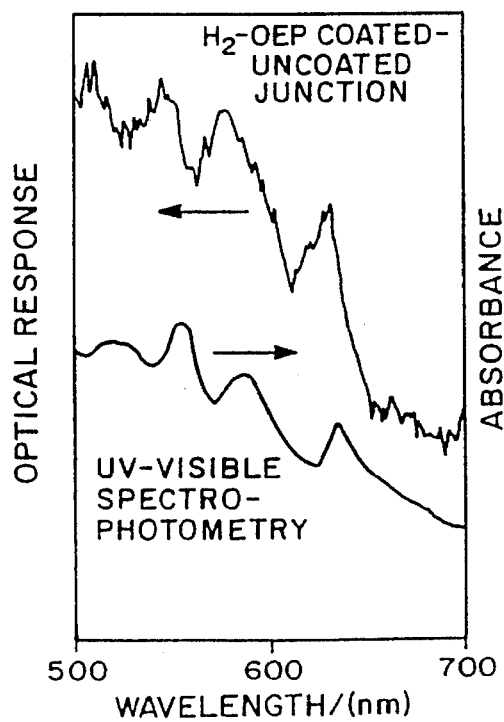
Fig_6
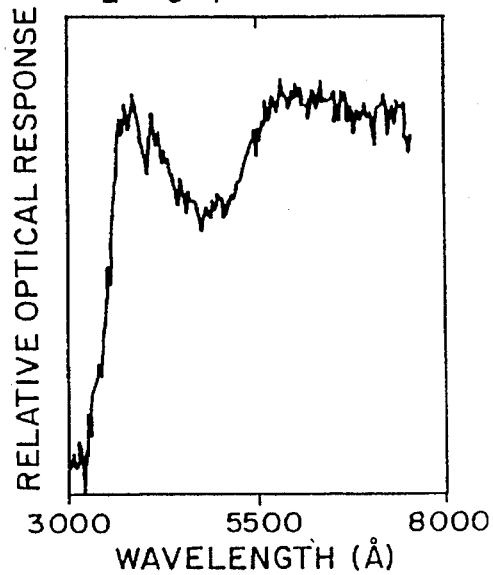
Fig_10

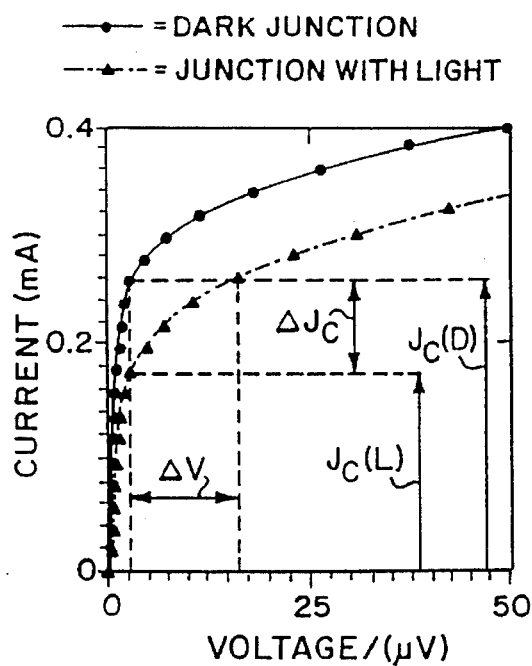
Fig_3A
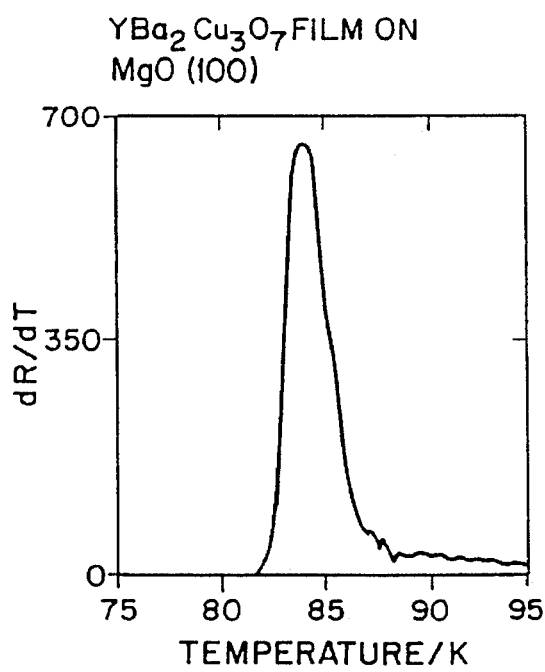
Fig_3B
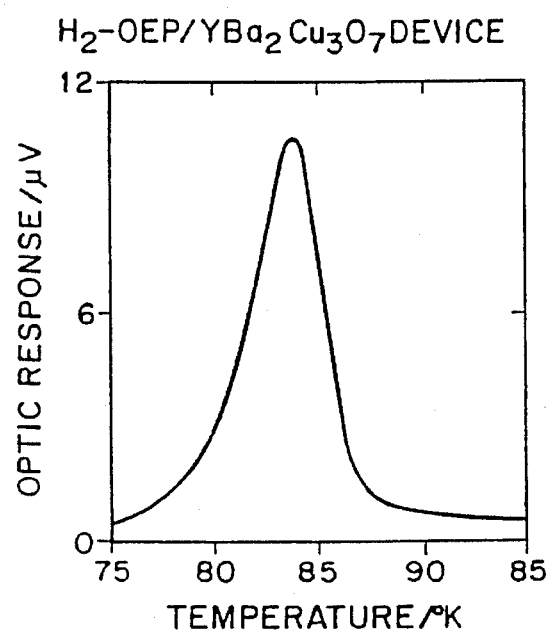
Fig_3C

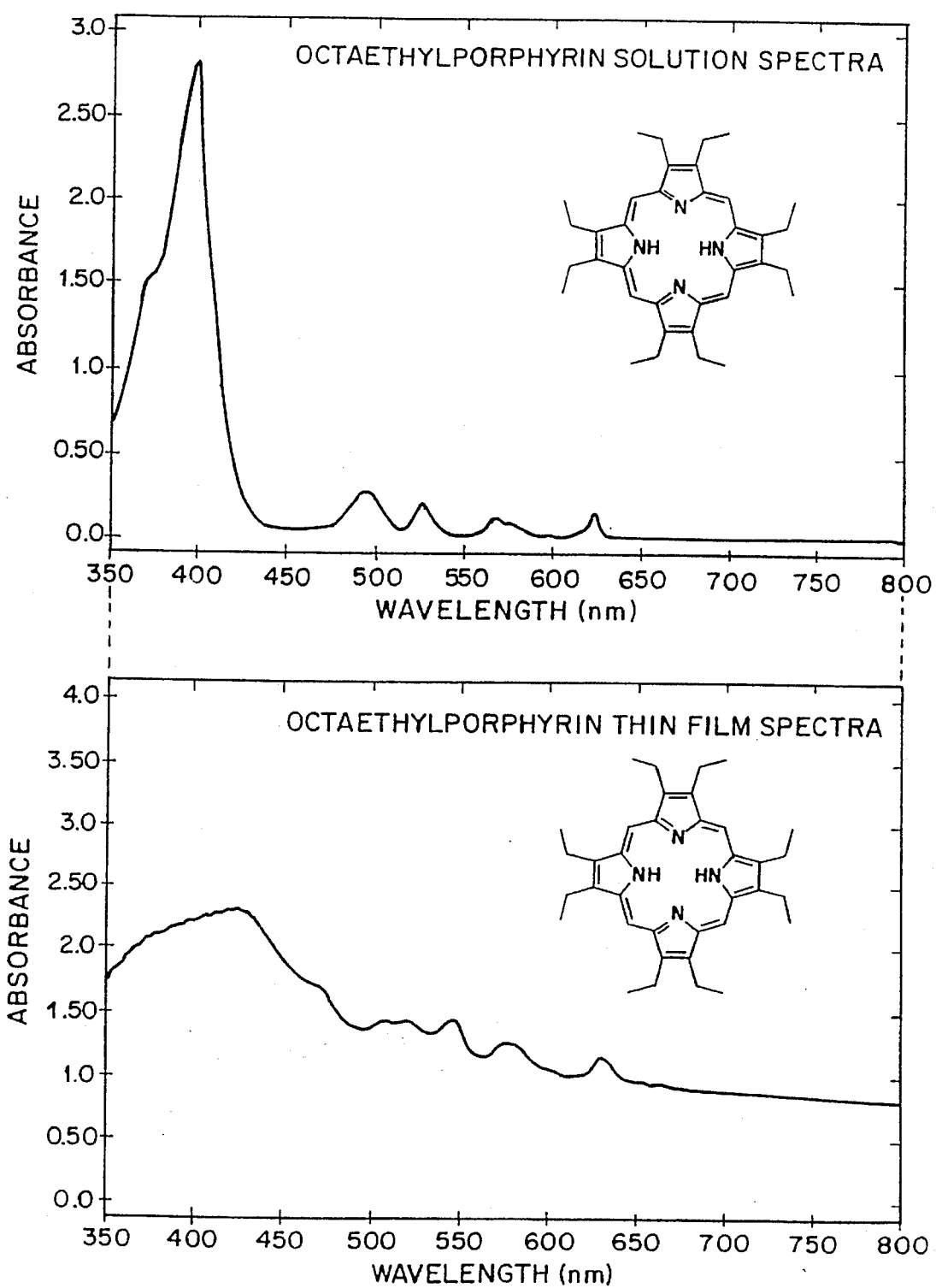
Fig_7

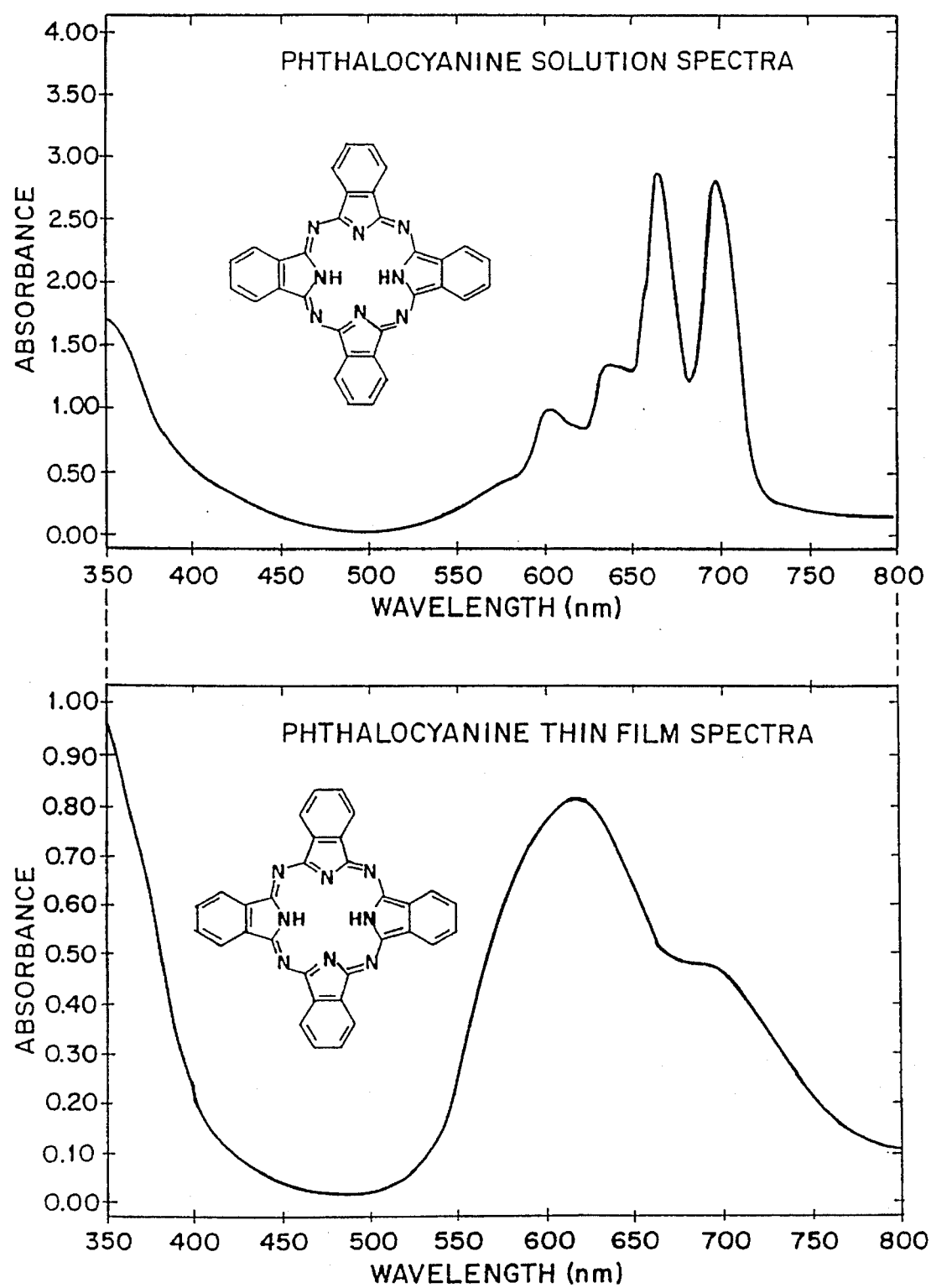
Fig_8

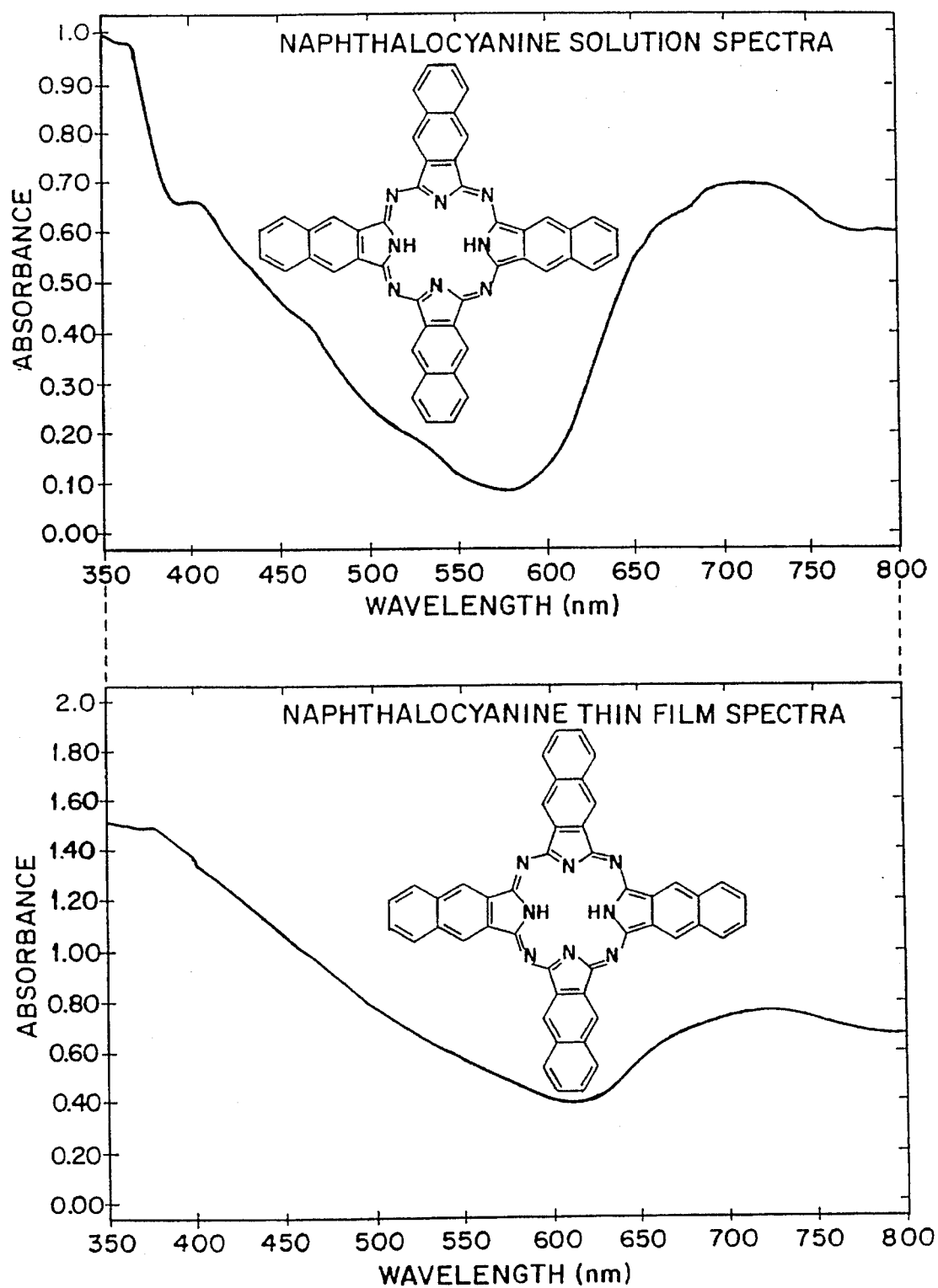
Fig_9

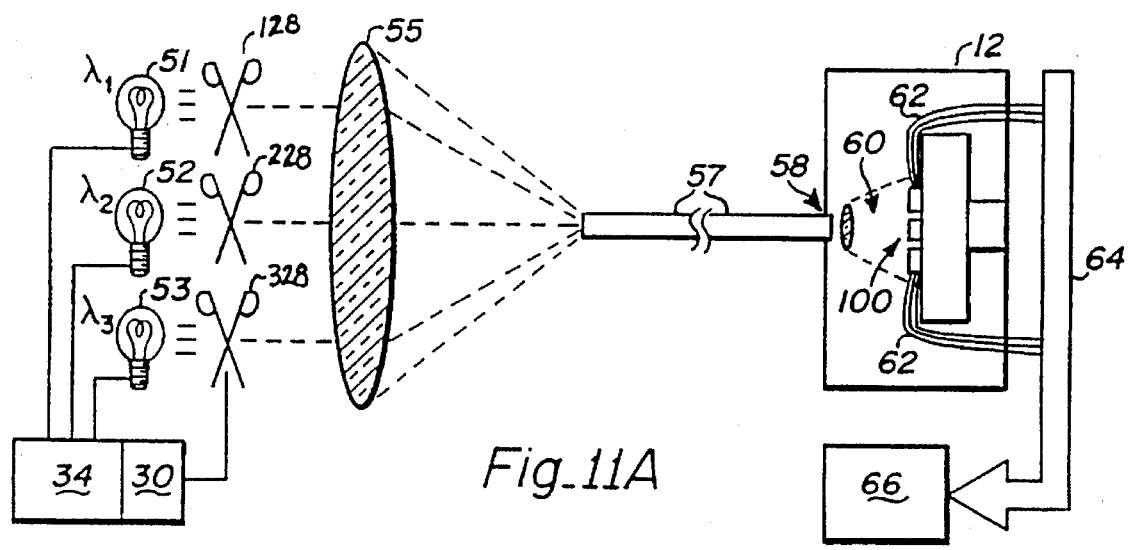
Fig_11A
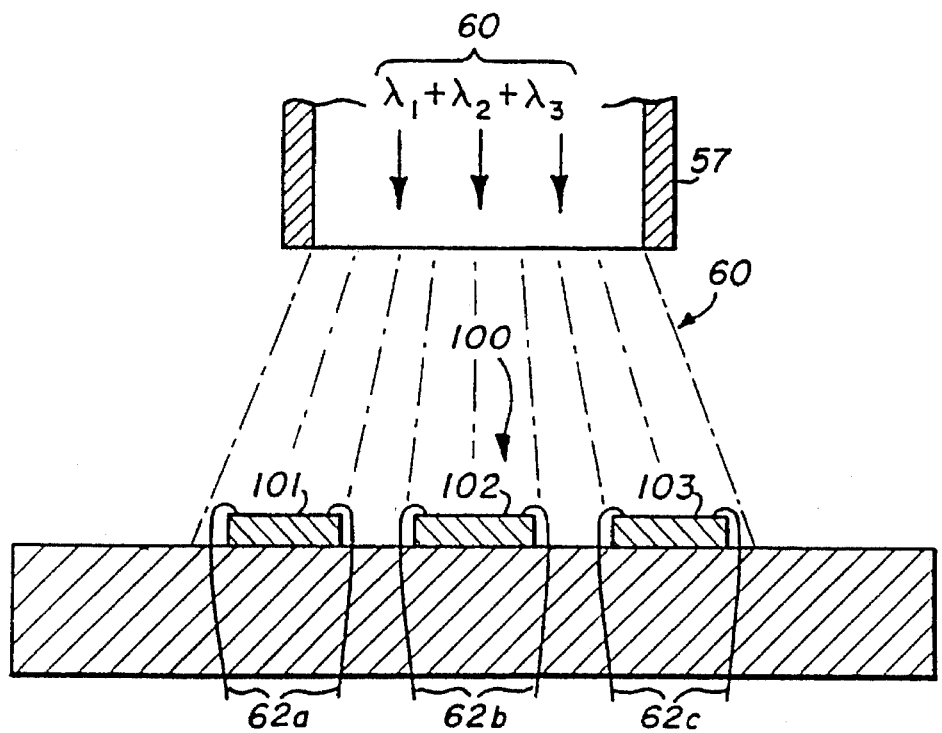
Fig_11B

Fig_16

OPTICAL RESPONSE CHARACTERISTICS (TABLE 1)

HYBRID, DYE ANTENNA/THIN FILM SUPERCONDUCTOR DEVICES AND METHODS OF TUNED PHOTO-RESPONSIVE CONTROL THEREOF

CROSS-REFERENCE TO RELATED APPLICATIONS:

This application is a continuation-in-part of our application filed by one of us, application Ser. No. 08/040,799, on Mar. 31, 1993, now abandoned, entitled Hybrid Dye-Coated Thin Film Superconductor Devices and Method of Tuned Response Control Thereof, the benefit of the filing date which we claim under 35 U.S.C. §120.

FIELD

This invention relates to the use of dye films and combinations thereof with reflective layers to modify the photoconductive responses of superconductor structures, and devices, and more particularly to superconductor devices and methods of tuned photo-response control thereof by application of a surface layer of a preselected dye or multilayer dye/reflective coating combinations applied on a surface of a selected thin film superconductor element which, upon exposure to selected frequencies of light, acts as both a color specific filter and an antenna (i.e., sensitizing layer) responsive to the light energy absorbed thereby temporarily altering the resistive properties of the underlying superconductor. For example, the hybrid dye/superconductor assemblies of this invention can be employed as color-specific (wavelength selective) optoelectronic switches, can increase the photo-responsivity of superconductive light sensor devices for telecommunication wavelength multiplexing, and can be employed in ultra sensitive light sensors for the visible near-infrared and infrared spectral regions.

BACKGROUND

Superconductor structures have been utilized previously to develop light detectors which exhibit high sensitivity, e.g., on the order of $10^{-3}$ to $10^3$ volts/watt, fast response time on the order of a nanosecond, and a wide working wavelength range which spans from the ultraviolet to the far infrared.

Although superconductivity was initially discovered by H. K. Onnes in 1911, it was only recently that superconductive materials with high transition temperatures were discovered. The initial superconductors required sophisticated cryogenic equipment and needed to be chilled with coolants such as liquid helium. These stringent requirements limited the number of applications for the low temperature superconductors. On the other hand, with the discovery in 1986 of cuprate materials having transition temperatures as high as 127° K., many new superconductor applications may be identified and commercialized in the near future. Most important in this regard is the fact that the high $T_c$ superconductors can be chilled with liquid nitrogen which has a boiling temperature of 77.5° K. Liquid nitrogen is relatively inexpensive and easy to use. Thus, high $T_c$ commercial applications are starting now to emerge, such as cryogenic fluid-level monitors and SQUIDS.

Currently, virtually all light sensors are made from solid state materials, such as semiconductors, metals and superconductors. An example of this type of light sensor is shown in Nishino et al, U.S. Pat. No. 5,057,485 which employs a photoconductive semiconductor disposed in intimate contact with a superconductor junction. The overlying semiconductor absorbs the light, but only in a broad, non-discriminating on bandwidth, i.e., a broad range of frequencies which means it is not easily tuneable to specific wavelengths of light. Once light is absorbed by the photoconductor in the Nishino system, charge carriers with relatively long lifetimes are generated in the semiconductor, and the effect persists after the light is switched off, i.e., it is not suitable for fast switching. Further, Nishino's system involves use of inorganic solid state photoconductive semiconductors such as CdS and CdSe. These materials are highly insoluble, refractory materials that are deposited onto the superconductor film using sophisticated sputtering or plasma deposition equipment and techniques. In the Nishino device, light exposure on the photoconductor causes the photogeneration of free charge carriers in the proximal semiconductor which influence the transport properties of the underlying superconductor. Such process leads to a weakening of superconductivity that can be sensed electronically.

Thin film superconductors have also been used as a photodetecting device. Murakami et al (U.S. Pat. No. 4,578,691) describes a photo-detecting device having a Josephson junction that is capable of detecting an optical signal at high speed. The device comprises a polycrystalline superconductor film formed over an insulating substrate. The polycrystalline superconducting film is necessary because light must penetrate into the semiconductor film in order to create quasiparticles in the irradiated superconductor. These quasiparticles change the superconductor energy gap, which in turn causes an output voltage change in the current-biased Josephson junctions. Murakami does not employ any dye layer for any purpose for wavelength discrimination.

The discovery of high temperature superconductors have also been used to investigate the photo-response of a superconductor to incident light. Forrester et al (Appl. Phys. Lett. 53 (14), Oct. 3, 1988) describes a high temperature epitaxial yttrium-barium-copper oxide (YBCO) superconducting film as an optical detector. Forrester does not employ a dye layer for any purpose. Forrester's results show that the response of the superconductor to polychromic light is bolometric. In other words, the polychromic light is absorbed by the superconductor and heats it to above its critical temperature To, thereby increasing its DC resistance.

Light can either be absorbed, transmitted, or reflected by a material. Generally, the intensity of reflected light from most materials has little variation over the visible region. Therefore, the absorbance and transmission spectra are typically near mirror-images of one another. This is shown for the dye, zinc octaethylporphyrin, in FIGS. 12 and 13. As is shown in FIG. 12, zinc octaethylporphyrin absorbs visible light very effectively around 380 nm with weaker absorption bands around 530 nm and 565 nm. At these wavelengths, incoming light is captured by the dye, and cannot pass through the sample. The transmission spectrum for the sample is shown in FIG. 2. Here, several broad transparent regions are present between 400 nm and 520 nm as well as at wavelengths greater than 575 nm. In these regions the dye layer transmits 90 to 95% of the incident light.

A wavelength selective filter transmits electromagnetic radiation in a narrow region around a specific wavelength, $\lambda_o$. All other wavelengths are rejected by the filter. Filters are usually not physically coupled to the sensor. A good example of a selective filter is the dye layers used in photography, color xerography, and color printing. For example, a yellow color filter when used in photographic applications must be able to transmit yellow light very well. During its operation the filter must be placed in front of the sensor (or film) in a manner whereby all light must go through the filter in order to reach the sensor (or film). If these conditions are met, the sensor (or film) cannot "see" any other colors such as cyan or magenta. This is how effective color separation is accomplished in photographic and xerographic processes.

The use of a transmission dye layer as a wavelength selective filter for a photo-conductive device is also known in the art. Fukaya al (U.S. Pat. No. 4,700,080) is directed to the fabrication and operation of arrays of color photosensors of amorphous Si (H, X). Fukaya et al shows that their device consists of seven layers (top to substrate):

(1) At least one color pigment layer (filter), over a (2) Protective layer (insulating organic film or resin), over a (3) Conductive layer (electrode), over an (4) $n^+$ ohmic contact layer, over an (5) Amorphous silicon over-layer (photoconductor element), over an (6) Amorphous silicon under-layer (photoconductor element), on a (7) Substrate Fukaya et al teaches that polychromic light irradiating onto the top filter layer of the structure results in absorption of certain wavelengths of light. Those wavelengths of light absorbed most strongly by the dye layer (#1) do not reach the photoconductive material layers below (#4 and #5), and are separated by two layers, the insulating layer #2 and the electrode #3. Only those wavelengths not absorbed by the filter are transmitted through three layers and down into the photoconductor elements wherein photogenerated charge carriers are created only by those transmitted wavelength(s). The creation of such carriers lead to an increase in the measured photocurrent of the element. These events form the basis for the photodetection of the colored light according to Fukaya et al.

Although it is quite common for dye materials to exhibit very narrow absorption bands in the visible region (see FIG. 12), in order to obtain very narrow transmission bands (as required for filter technology), it is often necessary to combine multiple filter layers due to the broad transmission regions exhibited by the dyes (see FIG. 13). This can be a considerable disadvantage due to the unavoidable losses of light of the desired wavelength that occur as a side-effect when multiple filter layers are combined. Thus, a limiting characteristic of a transmission dye filter is that in order to obtain any degree of wavelength selectivity the dye layer must either be relatively thick (greater than about 100Å) or multiple dyes applied over one another. However, as the dye layer becomes thicker, the dye tends to also absorb the wavelength of light whose transmission is desired. This results in a loss in sensitivity of the photo-detecting device.

Accordingly, there is a need in the art to be able to transmit specific wavelengths of light with a high degree of selectivity without the accompanying loss of sensitivity resulting from either excessively thick transmission dye layers or multiple layers of different dyes.

Wolf, in U.S. Pat. No. 3,956,727 shows a superconducting switch or bistable device comprising a superconductor positioned in a cryogenic chamber which is maintained just below the superconducting transition temperature, $T_c$. The cryogenic chamber includes a window that is transparent in the appropriate frequency range band for passing a laser beam, which beam impinges on a portion of the superconductor. The window is spaced away from the superconductor structure, shown in the patent drawings as a classic "Josephson junction" or superconductor "weak link structure." The impingement of the laser beam of the appropriate wavelength heats the superconductive device slightly so that its resistance increases. That is, it flips out of the superconducting state into the normally conductive metallic state, which is accompanied by a large increase in resistance. This forms the basis for the switch. Ostensibly the photo-bandpass window of Wolf is used to exclude all wavelengths of light except for the those wavelengths at or near the wavelength of the laser. Here, the light filter is used to allow only the intense monochromatic laser light to pass through while minimizing the transmission of ambient light.

Wolf and Forrester illustrate how the transmitted light in a superconducting photo-detector affects the conductivity of the superconductor. The incident wavelength of light heats up the superconductor which is maintained just below its critical temperature ($T_c$). Depending upon the thickness of the superconductor and the amount of transmitted light allowed through the transmission filter the bolometric response of the photo-detection device can be relatively slow when compared to devices such as those described in Murakami which operate nonbolometrically.

Accordingly, there is a need for a photo-detection device that exhibits a fast response time when light of the desired wavelength is detected.

Mizutani et al in U.S. Pat. No. 4,367,369 shows a solar battery formed by using a specific merocyanine dye on an n-type semiconductor substrate. The dye functions as a p-type semiconductor, thus forming a p-n junction on the inner face between the dye film and the n-type semiconductor substrate. In addition, light permeable metallic layers are coated onto the dye to form a 4-layer laminated structure. The dye film is said to absorb visible light "in a wide range of wave lengths."

Accordingly, there is a need in the art to provide sensors and devices that are rapidly and reversibly switchable, tuneable, highly efficient, and permit direct energy transfer in an optoelectronic system that in an array permits multiplexing by discrimination of unique tight bandwidth signals from amongst multiple signals delivered synchronously or asynchronously.

THE INVENTION

OBJECTS:

It is among the objects of this invention to provide a new generation of highly efficient, rapidly switchable, tuneable, wavelength selective light sensors elements and devices which are responsive to narrow bandwidths of light by use of dye coated superconductor junctions and which overcome the limitations of the background art.

It is another object of the invention to employ preselected dye layers alone or in combination with reflective coatings which act as antennas to modulate the photo-conductive response of the underlying superconductor element.

It is another object of the invention to provide hybrid dye thin-film superconductor devices and methods of tuned photoresponse control of such devices.

It is another object of the invention to provide a hybrid, dye antenna/thin film superconductor assembly maintained near $T_c$ which is tuneable to the wavelength of light in that the colors of light absorbed strongly by the dye serve to enhance the photo-conductive response of the superconductor while those wavelengths which are not absorbed yield more feeble photo responses.

It is another object of the invention to employ hybrid dye antenna/thin film superconductor elements in a new type of photothermal light detector in which the light absorption characteristic of solid dye films which are placed in contact with the superconductor element can be measured readily.

It is another object of the invention to provide hybrid dye antenna/thin film superconductor devices which can be employed as color-specific optoelectronic light switches, can increase the responsivity of the superconductive device for telecommunication wavelength multiplexing, and can be used in ultra sensitive visible, near-infrared and infrared detectors.

It is another object of the invention to provide highly efficient hybrid dye antenna/thin film superconductor elements which when assembled in an array permits multiplexed signal decoding by discrimination of unique narrow bandwidth signals from among multiple signals delivered synchronously or asynchronously, e.g., as polychromic light beams.

Still other objects will be evident from the specification claims and drawings of this application.

SUMMARY

The invention comprises use of selected dye films alone or in combination with reflective layers to modulate the photo responses of selected superconductor elements, structures and electronic devices employing cryogenically cooled superconductive elements, such as Josephson junctions and superconductor weak link devices, and to methods of tuned photoresponsive control of such devices. A surface of a thin film superconductor is coated with a preselected dye or dye in combination with a reflective layer which, when maintained near its $T_c$, upon exposure to a selected frequency of light acts as both a narrow bandwidth filter and an antenna to change the resistivity properties of the underlying superconductor.

An example is a Josephson junction superconductor bridge or "weak link" structure coated with a selective wavelength absorptive dye, such as a porphyrin or phthalocyanine dye to act as an antenna. The dye-coated junction is then exposed to light of a wavelength absorbed by the dye creating an excited state in the material which rapidly relaxes back to its ground state. Since the dye is in intimate contact with the electronically and thermally conductive superconductor element, the energy initially entrained in the photon flux is absorbed by the superconductor. This influx of energy serves to weaken the superconductive properties of the thin film which is poised at a temperature very close to $T_c$. At such temperatures, superconductivity is easily disrupted by the influx of even small amounts of energy. Thus, this dye-to-superconductor energy transfer process is a very sensitive light detection method.

In the preferred embodiment of the dye antenna/thin film superconducting device of this invention, See FIG. 17, a thin reflective layer is disposed between the dye layer and the thin film superconductor. While the effect of the dye antenna layer alone (i.e., no intermediate reflective layer) was unexpected in that the response of the underlying superconductor having the dye layer was greater than the response of a bare, uncoated superconductor to the same incident light, the effect of the intermediate reflecting layer was also unexpected in that the response of the superconductor underlying the reflective layer dye coating was accentuated over that of the dye layer coating alone. In other words, the reflective coating further increased the amplified response of the dye-only coated superconductor. In addition, the effect of the intermediate reflective surface further increases the wavelength discrimination of the overlying dye antenna.

Although the effect of the reflective coating in combination with the dye is significant, the reflective coating by itself (i.e., without the overlying dye) applied to the superconductor does not produce a response in the superconductor when the reflective coating is struck by incident light. An overlying absorptive dye layer is required for the effect to occur.

The mechanism underlying this phenomenon is not yet understood. It is thought that the reflective surface reflects the light penetrating the dye back through the dye layer with the result that those wavelengths not absorbed in the dye the first time are absorbed after being reflected back through the coating, thus doubling the antenna effect of the dye. Further, those light wavelengths not ordinarily absorbed by the dye (i.e., those wavelengths corresponding to the transmission spectra of the dye) are reflected back out of the coating and not allowed to penetrate into the superconducting layer. The net effect is a much higher wavelength discrimination (i.e., a higher "Q") and an accentuated response over just the dye by itself.

The mechanism of how the light energy is converted once it is absorbed and then conducted to the superconductor is also not fully understood. A hypothesis is that the absorbed light energy is converted and stored in the molecular lattice of the dye. The energy is dissipated as heat energy in the dye with the resulting thermal wave being conducted through the dye layer, through the reflective layer and finally into the superconductor where it raises the temperature of the superconductor. An alternate hypothesis is that the energy is converted in the molecular lattice of the dye, is conducted through the dye layer and the reflective layer and is then dissipated as heat in the superconducting layer. A third hypothesis is that the energy conducted into the superconductor is non-thermal in nature and the response of the superconductor to the energy wave is due to the disruption of the Cooper's electron pairs. It is thus fair to describe the dye layer as an energy harvesting element, in that it is collects and retains the electromagnetic energy of the spectral wavelengths impinging thereon.

The reflective layer may be any reflective material including metals, semiconductors and any other elements or compounds exhibiting the desired optical properties. The thickness of the reflecting layer may range from a monolayer, having negligible effect to greater than about 3000Å. Construction of actual devices having reflective coating thicknesses ranging from 800Å to 2000Å have yielded excellent results.

Dye layer thicknesses may range from less than about 50Å to greater than about 50,000Å. Construction of dye antenna reflective coating thin film superconductors having dye layer thicknesses ranging between 200Å to 14,000Å have yielded devices exhibiting excellent photo-detection capabilities. A unique aspect of the dye antenna of this invention is that the dye layer may be applied in thicknesses that are other wise opaque.

Application of the reflective coating to the thin film superconductor may be by any method including RF magnetron sputtering, evaporative deposition and non-aqueous "wet" chemical methods.

In another embodiment, a plurality of elements can be arrayed with each element junction being sensitized by overcoating with a different dye so that upon exposure to a broad spectrum light source or a polychromic light source, the junctions will be switched independently or not depending on the wavelength to which the superconductor is tuned by the selected dye overcoating, thereby permitting multiplexed photo-optical message transmission and detection. For example, a single optical fiber may carry a plurality of information streams, each encoded in a different color of light, transmitted simultaneously as a polychromic beam. The element array of this invention can distinguish between the different signals, as each detector is tuned to a selected encoded light color.

The molecular dyes of the invention enhance the sensitivity of these superconductor devices and provide them with wavelength selectivity. That is, they are tuneable in that certain frequencies can be sensed more readily than others. The use of the dye coatings converts an otherwise broad spectrum nonselective system which responds indiscriminately to a broad spectrum of light, into a highly selective, narrow peak bandwidth, rapid response device that is wavelength tuneable and whose response has been enhanced to be sensitive to smaller signals.

While not wishing to be bound by theory, it is presently believed that the physical pathway by which the absorbed light energy interferes with superconductivity is by virtue of the "antenna effect" of the dye. Specific energies of light are selected (as in an antenna) and converted in the molecular lattice of the dye. The energy is conducted through the molecular lattice of the dye and is finally dissipated as thermal energy within the superconductor.

That is, when a broad bandwidth beam of light impinges on the surface of the absorptive dye, specific frequencies of that light are absorbed by the dye and converted to energy in the molecular lattice of the dye. Those particular or discrete frequencies of light energy converted to energy in the molecular lattice of the dye correspond to the energies associated with the molecular lattice of the dye. This explains the extremely high selectivity, or narrow bandwidth response, associated with the hybrid dye-coated superconducting device of this invention. The energy is conducted through the dye-layer lattice until the dye-superconductor interface is reached. The energy stored in the molecular lattice is then dissipated as heat energy within the superconductor which in turn increases the temperature of the superconductor. Accordingly, we believe that the dye-absorbed light is converted to energy in the dye's molecular lattice. This energy is conducted through the dye layer and is dissipated as heat within the superconductor layer, thus warming up the superconductor, which is maintained at or near $T_c$, to degrade its ability to conduct electricity without resistance. The light causes a change in conductivity which is easy to monitor electronically. However, it is possible that some electron transfer phenomenon may occur in certain systems and that there may be other nonthermal energy transfer channels that serve to transfer the energy from the excited dye chromophore to the superconductor element.

The response time of the photo-detector of this invention is significantly improved over that of a device operating under a purely bolometric mechanism. Light energy absorbed and converted by the dye layer is conducted rapidly through the molecular lattice, i.e., as lattice energy, not as a bolometric wave. The energy is transferred and available almost immediately as a result of the intimate contact of the dye on the superconductive film, and thereafter the thermal energy is dissipated within the superconductor layer. In contrast, a device relying on light transmission to the superconducting layer will take longer to elicit a response, since a spaced transmission filter exhibiting a comparable wavelength selectivity will provide only a small amount of transmitted light energy resulting in a weak and slow bolometric response.

The effect of the wavelength selection mechanism of this invention is significantly different from the effect of a device relying on a transmission filter dye. Both effects can be used to couple electromagnetic radiation to photosensitive or thermally sensitive elements. However, a good wavelength selective antenna is one which can effectively absorb electromagnetic radiation in a narrow region around a specific wavelength, $\lambda_o$. All other wavelengths will not be sensed effectively. This behavior is analogous to how a radio antenna can 'tune' into one radio station and not sense the signals from all the other stations. Further, to function properly, an antenna typically must be coupled directly to the sensor.

Transmission dye filters, which can also be used for wavelength-discrimination, work in a very different manner. A good selective filter transmits electromagnetic radiation in a narrow region around a specific wavelength $\lambda_o$. All other wavelengths are rejected by the filter. Filters are usually not physically coupled to the sensor (for example, the many layers associated with Fukaya et al.'s device). Another substantial difference between hybrid dye antenna devices and transmission filters for wavelength-discrimination is the requirement that the region around $\lambda_o$ very narrow. A Transmission filter would thus require thicker or multiple filter layers due to the broad transmission regions exhibited by transmission filter dyes. This can be a considerable disadvantage due to the unavoidable losses of light of the desired wavelength that occur as a side-effect when multiple filter layers are combined.

In the absence of a dye filter layer a silicon-based photodetector displays a flat spectral response across the visible region as is shown in FIG. 14. After incorporation of the dye layer, only those colors of light which are transmitted by the dye can cause optical response in the underlying photodetector. All other wavelengths of light are blocked from reaching the photodetector due to absorbance at the filter media. Shown in FIG. 15 is the response behavior for a nonantenna dye spaced filter prepared from Rhodamine 6G measured with a silicon-based photodetector. The spectral features seen here are exactly identical to those associated with the transmission spectrum of the same dye film. Extremely thick (greater than about 200Å) layers of dye, or layers that are opaque (i.e. black) cannot be used for transmission dye filters because they block all the light from reaching the photodetector element.

On the contrary, the optical response behavior of a Rhodamine 6G dye antenna/superconductor optical sensor of this invention is illustrated in FIG. 16. This FIG. shows that the colors of light that are transmitted through the dye do not cause a significant photoresponse. Rather, the opposite behavior is apparent. Those wavelengths of light absorbed by the dye and converted to molecular lattice energy lead to large enhancements in the optical response. Thus, the dye antenna/superconductor response follows the absorption spectrum of the dye, and not the transmission spectrum. This is significant in that it clearly shows that the absorbed energy is converted and then conducted to the superconducting layer as lattice energy.

Moreover, opaque dye films can be used in this application. These results demonstrate that the dye functions as a light antenna. Absent direct physical contact between the dye layer and the superconductor, this antenna/lattice energy optical response is lost. This behavior is contrary to the Fukaya system where the dye layer is positioned away from the photoelement.

In the hybrid dye antenna/superconductor detectors of this invention, the dye leads to superconductor response enhancements (as compared to a bare superconductor) at those wavelengths absorbed by the dye. In the transmission dye systems (the Fukaya system), on the other hand, the dye leads to decreases in superconductor response at these same wavelengths. Evaluation of the mechanisms of the two systems reveals important differences. In the Fukaya system, transmitted light is absorbed directly by the photodetector. In the dye antenna system of this invention, light is absorbed by the dye and not the superconductor. This difference in the role of the dye leads to the opposite spectral response behavior noted above. Since the dye antenna system of this invention relies on absorbance of light, it is possible to create systems which respond more selectively to different colors of light. The Fukaya system is limited to the broad spectral windows available with transmitted light from dye filter layers. Moreover, the fact that dye antenna systems lead to an enhancement in responsivity, more sensitive optical sensors can be made.

A particularly important aspect of the above-mentioned dye antenna/superconductor devices is that the light absorbing properties of the dye layer as well as the conductive and superconductive properties of the superconductor element can be tailored independently of one another. This flexibility affords the possibility of fabricating a large number of different dye antenna/superconductor sensors and devices suitable for a variety of different applications.

A wide range of different classes of dye molecules may be employed with selection criteria including: Chemical stability; relative ease of synthesis; and good coatability by vapor deposition or spin coating. Important in this regard are dye systems which do not corrode or otherwise degrade the underlying superconductor or the substrate. Particularly attractive classes of molecular dyes are porphyrins, large flat macrocyclic aromatic molecules which absorb light strongly in the visible region. For near infrared (NIR) detectors, closely related macrocycles such as phthalocyanine and napthalocyanine show particular promise. The Soret band (i.e., the most intense absorption band) shifts from 400 nm (4000Å) for octaethylporphyrin, to 650 nm (6500 Å) for phthalocyanine, and to around 725 nm (7250 Å) for naptha-locyanine. Other metal substitutions and peripheral derivitizations can cause further shift in the absorption peaks to the near infrared. Development of near-infrared light sensors is particularly important for the field of optoelectronics. In contrast, currently available light sensors in this spectral region are not particularly sensitive.

Likewise a wide variety of superconductor compositions can be employed, with the high temperature compositions being preferred. Examples include Yttrium, Thallium and Bismuth-based superconductive materials, such as $Y_1Ba_2Cu_3O_{7-\delta} 0<\delta<1.0$ (herein YBCO) having a nominal 92° K. $T_c$, $Tl_2Ba_2Ca_1Cu_2O_8$ with a nominal 125° K. $T_c$ and $Bi_2Sr_2Ca_2Cu_3O_{10}$ with a nominal $T_c$ of 110° K. A presently preferred substrate is crystalline MgO (100), although a wide variety of conventional substrates such as $SrTiO_3$, $LaAlO_3$, $Al_2O_3$, Si, and the like may be employed.

The thin film superconductor may range typically from about 40 nm (400 Å) to about 500 nm (5000 Å) in thickness, with the various junction or linkage geometry being formed by conventional lithographic or laser ablation photoetching procedures. The dye layer may range in thickness typically greater than 100 Å and preferably from about 50 nm (50 Å) to about 5000 nm (50,000Å) in thickness. Thickness values for both the superconductor and dye layers will depend highly on the nature of the application, dye extinction coefficient, spectral range, superconductor film quality, etc. Thus, the abovementioned thickness values serve only as general guidelines and not to limit the scope of the dye/superconductor devices.

A variety of conventional and high-$T_c$-superconductor materials are suitable for the fabrication of the dye-superconductor devices of the invention. Representative examples of such superconductors include cuprate superconductors such as $La_{2-x}Ba_xCuO_4$ (0<x<0.4); $La_{2-x}CuO_4$ (0<x<0.4); $RBa_2Cu_3O_{7-\delta}$, where R is $Y^{3+}$ or a lathanide or actinide ion; simple modifications of $RBa_2Cu_3O_{7-\delta}$ in which $La^{3+}$ or $Sr^{2+}$ are substituted into the $Ba^{2+}$ site, or $Ca^{2+}$ is substituted into the rare earth site and R is the aforesaid; $Bi_2Sr_2CaCu_2O_8$; $Bi_2Sr_2Ca_2Cu_3O_{10}$; $Pb_xBi_{2-x}Sr_2Cu_3O_{10}$ (0<x<1); $Tl_2Ba_2Ca_2Cu_3O_{10}$; $Tl_2Ba_2Ca_1Cu_2O_8$; $Nd_{2-x}Ce_xCuO_4$; (0<x<1); $Nd_{2-x}Th_xCuO_4$ (0<x<1); bismuth oxide superconductors such as $K_{1-x}Ba_xBiO_3$ (0<x<1); $Rb_{1-x}Ba_xBiO_3$ (0x<1); $BaPb_{1-x}Bi_xO_3$ (0<x<0.4); conventional elemental superconductors such as Pb, Sn, Nb, Hg, and the like; binary superconductors such as $Nb_3Ge$, $Nb_3Sn$, $N_bN$, PdH, and the like, and mixtures or co-compositions thereof.

Dyes which are shown in the specific examples herein include $H_2$-octaethylporphyrin, rhodamine 6G, $H_2$-phthalocyanine, and $H_2$-napthalocyanine. Additional candidate dyes include:

I. Near-Infrared Absorbing Dyes
  A. Macrocyclic
    1. Phthalocyanines
    2. Naphthalocyanines
    3. Substituted Porphyrins
    4. Corroles
  B. Polymethine Cyanine Dyes
    1. Heptamethinecyanines
    2. Squarylium Dyes
    3. Croconium Dyes
    4. Chalcogenopyrlomethine Dyes
    5. Merocyanines
  C. Quinone Dyes
    1. 1,4-diaminoanthraquinone (N-alkyl)-$3^1$-thioxo-2,3,-dicarboximides
    2. Indanthrene dyes
    3. 2-arylamino-3,4-phthaloylacridones
    4. Trisphenoquinone
    5. Metal complexes of naphthoquinones, anthraquinones, azaindonaphthols, etc.
  D. Azo Dyes
    1. Intramolecular Charge-Transfer Azo Dyes
II. Visible Absorbing Dyes
  A. Rhodamine Dyes
  B. Squaraines
  C. Azo Dyes
  D. Perylene Dyes
  E. Anthraquinone Dyes
  F. Polycyclic Aromatic Carbonyl Dyes
    1. Coumarin Dyes
    2. Florescein Dyes
  G. Polymethine Cyanine Dyes
  H. Polyaryl Carbonium Dyes
    1. Oxazine Dyes
    2. Malachite Green
III. Macrocyclic Dyes (free-base and metallated forms useable)
  A. Octaethylporphyrin
  B. Phthalocyanines
  C. Napthalocyanines
  D. Meso-Tetraphenyl Porphyrin
  E. Tetrabenzoporehyrin
  F. Octamethyltetrabenzoporphyrin
  G. Meso-tetratolylporphrin
  H. Meso-tetratolyporphrin
  I. Related Chlorins J. Related Chlorophytins
K. Related Corroles IV. Fluorescent Dyes
  A. Fluorescein
  B. Rhodamine 6G
  C. Cresyl Violet
  D. Phenoxazone
  E. Oxazine V. Photochromic Dyes
  A. Malachite Green
  B. Spiropyran dyes
  C. Thioindigo dyes
  D. Oxazine dyes VI. Electrochromic Dyes
  A. Lutelium Bisphthalocyanine
  B. Inodline cyanine VII. Photoconductive Dyes
  A. Titanium Oxide Phthalocyanine
  B. Napthalocyanines
  C. Unsymmetrical Squaraines
  D. Perinones
  E. Poly(vinyl carbazole)(trinitrofluorenone)

VIII. Polymeric Chromophores
  A. Poly(3-alkyl thiophene)
  B. Polypyrrole
  C. Poly (vinyl carbazole) (trinitrofluorenone)
  D. Polyanilne IX. Liquid Crystalline Dyes
  A. Alkyl substituted porphyrins
  B. Alkyl substituted phthalocyanines

DRAWINGS:

The invention is illustrated by reference to the drawings in which:

FIG. 2 is a resistivity vs. temperature plot for a $YBa_2Cu_3O_{7-\delta}$ (YBCO) microbridge on a single crystalline MgO (100) substrate prepared by the process of FIG. 1;

FIGS. 3a, 3b and 3c are a series of plots of the current, voltage, resistivity-temperature derivative and temperature dependence of the optical response of the device of FIGS. 1 and 2;

FIG. 3a illustrates current voltage, resistivity-temperature traces for the dye-coated microbridge device;

FIG. 3b illustrates the first derivative (dR/dT) of the resistivity vs. temperature plot of FIG. 2;

FIG. 3c illustrates the optical response curve measured as a function of the temperature of the device;

FIG. 5 illustrates the comparative optical response vs. wavelength curves for an OEP dye-coated vs. uncoated YBCO microbridge of this invention;

FIG. 6 illustrates the comparison between the absorption spectrum of a 1.1 μm thick solid OEP dye film measured by UV-visible spectrophotometry (lower curve) compared to the normalized optical signal of the hybrid dye superconductor device of the invention with the uncoated junction response subtracted away (upper curve);

FIG. 7 shows the visible absorbance spectra taken with an 8450 HP diode-array spectrophotometer for $H_2$-OEP in hexane solution (top) and in a sublimed thin film on glass slide (bottom);

FIG. 8 shows the visible absorbance spectra taken with an 8450 HP diode-array spectrophotometer for $H_2$-phthalocyanine in 1-chloronapthalene solution top, and in a sublimed thin film on glass slide (bottom);

FIG. 9 shows the visible absorbance spectra taken with an 8450 HP diode-array spectrophotometer for $H_2$-napthalocyanine in 1-chloronapthalene solution (top) and in a sublimed thin film on glass slide (bottom);

FIG. 10 shows the normalize optical response vs. wavelength for a phthalocyanine film coated YBCO microbridge device of the type illustrated in FIG. 1, with uncoated junction response subtracted away being shown;

FIG. 11a shows a schematic of a multiplex signal sending, receiving and decoding assembly comprising an array of microbridge elements, each of which is coated with a different dye and on which impinges a polychromatic (multicolor) modulated light signal;

FIG. 11b is an enlarged view of the element array exposed to fiber optic cable modulated polychromic light delivery;

DETAILED DESCRIPTION OF THE BEST MODE

The following detailed description illustrates the invention by way of example, not by way of limitation of the principles of the invention. This description will clearly enable one skilled in the art to make and use the invention, and describes several embodiments, adaptations, variations, alternatives and uses of the invention, including what we presently believe is the best mode of carrying out the invention.

EXAMPLE 1

Figure 1:
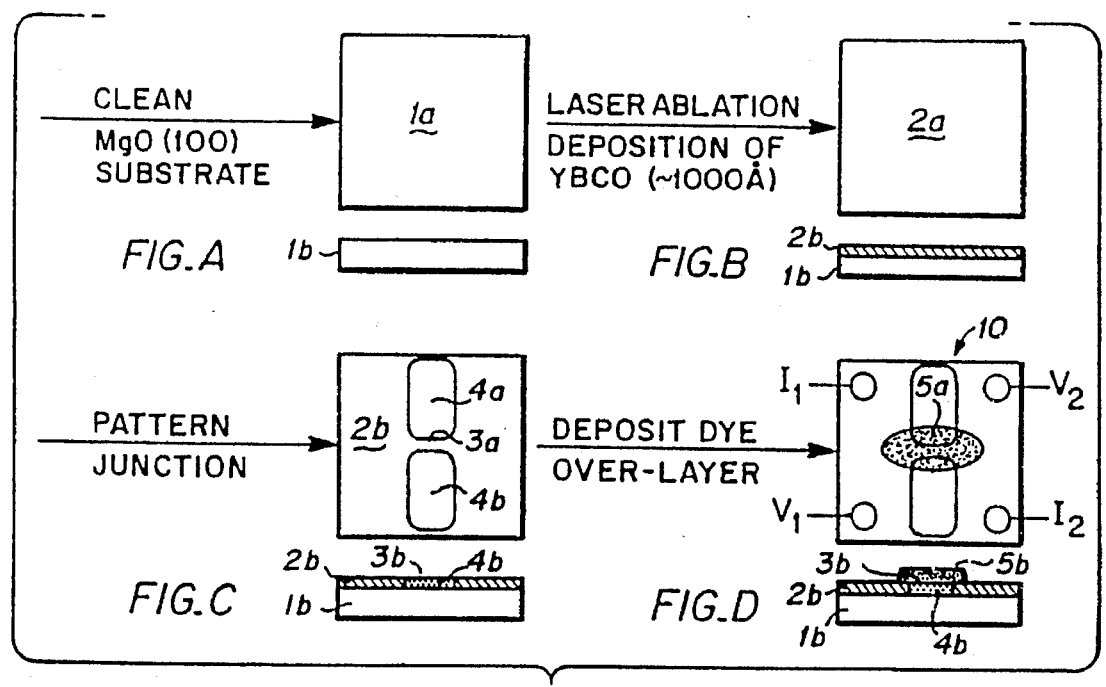
FIG. 1 is a schematic illustration showing the basic steps of fabrication of the hybrid dye coated thin film superconductor devices of the invention.

FIG. 1 is a schematic illustration of the steps utilized to fabricate a typical dye-coated thin-film superconductor of this invention, which by way of example only is shown as a superconductor microbridge weak link junction. In step A, an MgO (100; single crystal MgO) substrate, shown in plan view as 1a and in side elevation as 1b, is cleaned by repeated solvent washing. Then in step B a 100 nm (1000 Å) layer of the high-temperature superconductor $YBa_2Cu_3O_{7-\delta}$ is deposited on the surface by a conventional laser ablation technique, as described in Dijkkamp, D. *Appl. Phys. Lett.* 1987, 51, 619–621 and in Char, K., *Appl. Phys. Lett.* 1990, 56, 785–787. The coating 2a, 2b is shown as resulting from step B. Then, in step C, a superconductor microbridge 3a, 3b around 3 mm long and 50 μm wide is created in the YBCO film 2a by negative mask imaging the bridge and ablating selective regions 4a, 4b of the film with one shot of a focused excimer laser beam. This photoetching procedure is described in Vase, P.; Yuenjiang, S.; Freitoft; T., *Appl. Surf. Sci.* 1990, 46, 82–86. Then in step D, a 100–300 nm (1000–3000 Å) thick film of octaethylporphyrin dye (OEP) 5a, 5b is deposited onto the microbridge by vacuum sublimation. Input/output current and voltage leads $I_1$, $I_2$ and $V_1$, $V_2$ are attached for device testing. The hybrid dye/thin film superconducting device is identified as 10 in FIG. 1.

FIG. 2 shows the resistivity vs. temperature plot for the YBCO microbridge (3 mm×50 μn) of FIG. 1. The superconductor film was deposited by excimer laser ablation and is approximately 300 nm (3000 Å) thick. The octaethylporphyrin coating is also approximately 300 nm (3000 Å) thick.

FIG. 3a shows current vs. voltage traces for an uncoated YBCO microbridge 3 mm×50 μm device. The data was acquired at a temperature just below $T_{c(mid)}$. Two curves are shown, the lower with, and the upper without a 1 mW He-Ne laser beam directed at the junction. Dye-coated devices exhibit similar cures, except larger voltage shifts are obtained.

FIG. 3b shows the first derivative of the resistance vs. temperature plot for the OEP-coated YBCO microbridge of FIGS. 1 and 2. The derivative peak is located at about 84° K. identifying this value as the transition temperature for the film. Note that the lowering of $T_c$ below the value of 92° K. which is obtained for bulk samples of YBCO is common for thin films deposited onto MgO. Moreover, through careful selection of the deposition parameters it is possible to tailor the $T_c$ values to a desired temperature range. Films having $T_c$ values close to 77° K. are particularly convenient for operation of devices using liquid nitrogen as the cryogenic fluid.

FIG. 3c shows the optical response in μV vs. temperature in ° K. for the OEP-YBCO device of FIGS. 1 and 2. A constant direct bias current was applied through the bridge, and chopped monochromatic light (see FIG. 4) 560 nm (5600 Å) of constant intensity (4.6×10⁻⁵ W/cm²) was focused on the microbridge junction. FIG. 3c clearly shows that the largest optical response for the dye/superconductor device occurs when the temperature of the structure is maintained close to $T_c$. Above $T_c$ there is no response because there is no superconductivity to disrupt. Well below $T_c$ there is no response because the superconductivity is too strong to disrupt with the modest light intensity employed.

Figure 4:
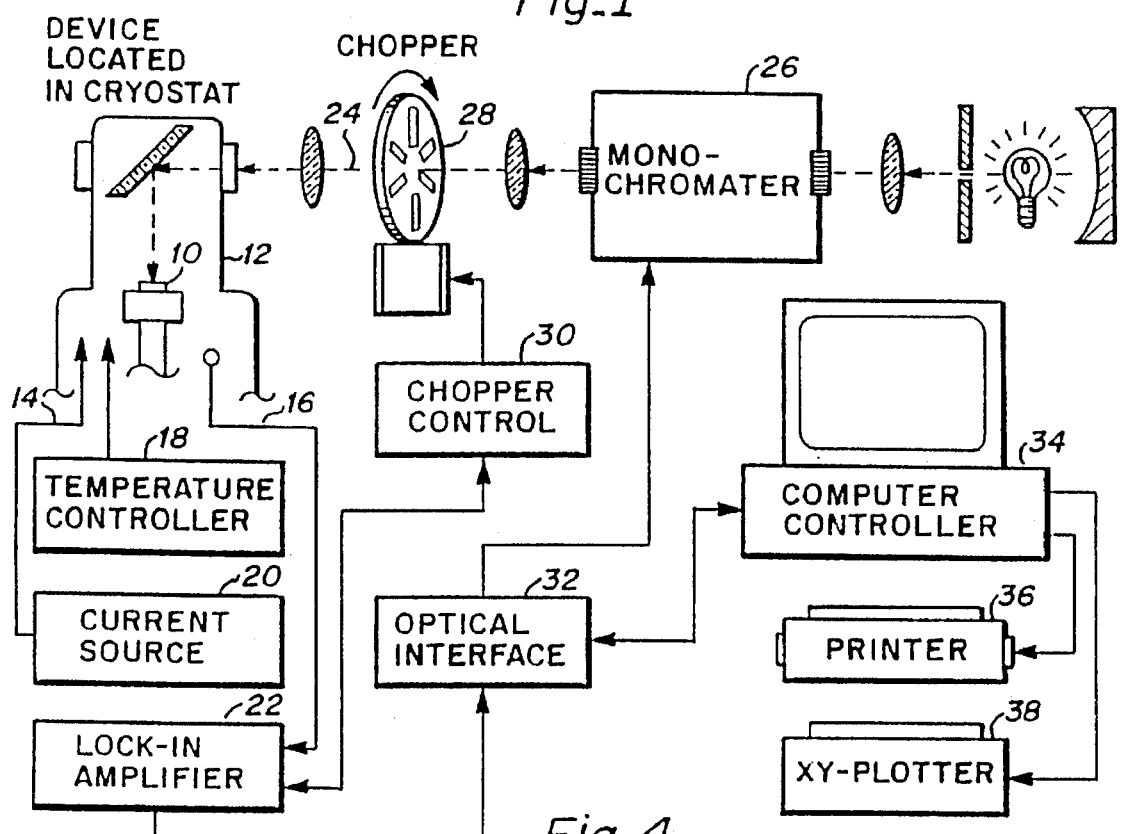
FIG. 4 is a schematic illustration of a device testing and operating setup.

As shown in FIG. 4, to study the optical response of the device, the hybrid dye antenna/thin film superconductor assembly 10 is mounted into an optical cryostat 12, and one voltage and one current lead 14, 16 are attached to either side of the microbridge. (See FIG. 1). After characterization by resistivity vs. temperature (FIG. 2), current-voltage (FIG. 3a) and $T_c$ current measurements, the device is cooled down by controller 18 to just below the transition temperature by of the superconductor film, and a constant direct bias current is applied across the junction by source 20. The optical response of the dye-superconductor device is measured with a lock-in amplifier 22 as a function of wavelength by monitoring the in-phase voltage which develops across the microbridge when chopped (20–25 Hz) monochromatic light 24 from monochromater assembly 26 is focused onto the junction area. Chopper 28, chopper controller 30, optical interface 32 and system computer controller 34 having a printer 36 and xy-plotter 38 are operatively linked as shown.

The unprocessed optical response at a $YBa_2Cu_3O_{7-\delta}$ microbridge with and without a 330 nm (3300 Å) thick octaethylporphyrin film is illustrated in FIG. 5. The $T_c$ can be moved within the range of about 0° K. to 90° K. depending on purity and quality of the YBCO film. For FIG. 5, the optical response curves were recorded at a temperature of 48° K. using a bias current of 5 mA. The transition-temperature midpoint for the device was close to 55° K. In both cases, the largest response is recorded at wavelengths where the monochromator/quartz halogen light source combination throughput was maximized. The uncoated microbridge junction exhibits a rather featureless response as shown in the lower plot in FIG. 5. Since there was a small increase in the microbridge resistance following the dye deposition, some of the increase in signal for the dye-coated device may be attributed to this resistance increase. As shown in the upper plot in FIG. 5, the dye-coated superconductor structure of this invention, on the other hand, exhibits enhanced sensitivity as well as sharp features in the response curve that are absent for the bare junction (lower plot). Most importantly, the frequencies at which enhanced responsivity occurs correspond to those wavelengths which are absorbed strongly by the dye film.

The lower curve in FIG. 5 shows the behavior for the uncoated superconductor. Upon deposition of the dye onto the structure, the responsivity of the device increases dramatically, upper curve in FIG. 5. Thus, the sensitivity of light detectors is significantly increased. Moreover, careful inspection of the optical response reveals that the greatest enhancement in the optical signals are recorded at those wavelengths of light that are absorbed strongly by the dye. Comparison of the enhancement in sensitivity caused by the dye (FIG. 6; top curve) with the absorption spectrum measured with a conventional UV-Visible spectrophotometer (FIG. 6; lower curve) demonstrates this point extremely well.

FIG. 6 provides a comparison between the absorption profile of a 1.1 μm thick OEP dye film on a glass slide as measured by UV-Visible spectrophotometry (lower curve), and the response of the OEP dye-superconductor microbridge (upper curve). The latter has been normalized to the light intensity at a given wavelength, and the response of the uncoated junction has been subtracted away. From a comparison of the upper plot in FIG. 6 with the spectrophotometric curve of the dye (lower plot in FIG. 6), it is clear that those wavelengths which are absorbed most strongly by the dye lead to the largest response for the hybrid dye superconductor device. Thus, molecular dyes can be exploited to sensitize superconductor junctions to enhance both the responsivity and the wavelength selectivity of the device. Moreover, since the normalized optical response of the composite device parallels the absorbance spectrum of the dye overlayer, the device can be exploited to photoelectrically measure the absorbance characteristics of a solid dye film.

EXAMPLES 2 AND 3

In a similar manner, hybrid devices as in FIG. 1 were prepared using dye films of phthalocyanine and rhodamine 6G. In all cases, including octaethylporphyrin (free base and copper derivatives), where degradation of the underlying superconductor was avoided, the molecular layer served to alter the response of the underlying superconductor structure in a reproducible fashion. Moreover, the magnitude of the response is greatest when the device is operated near $T_c$ and no appreciable response is observed for $T>T_c$.

EXAMPLES 4 AND 5

Figure 12:
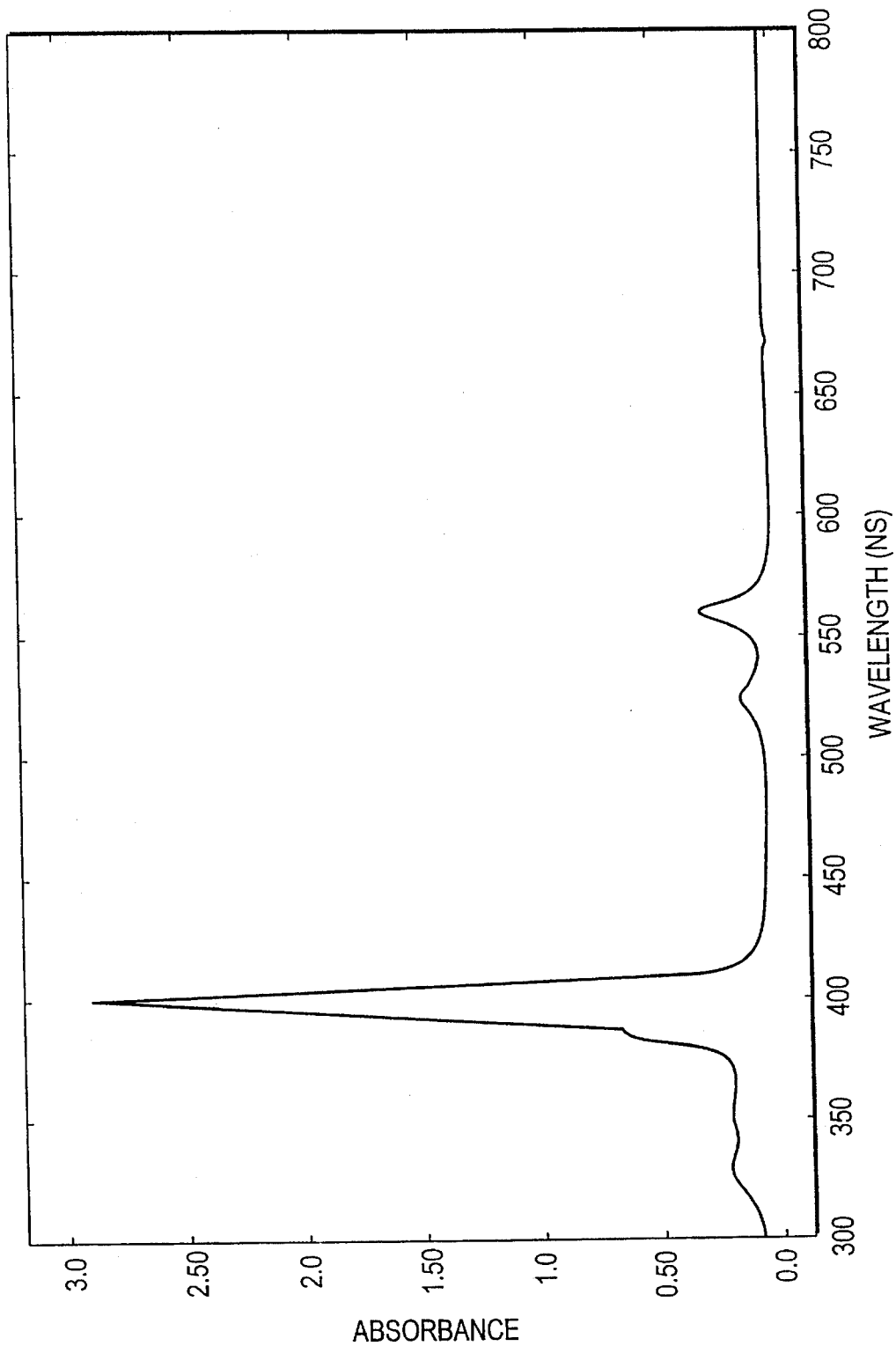
FIG. 12 is an absorption spectrograph of zinc octaethylporphyrin dye.
Figure 13:
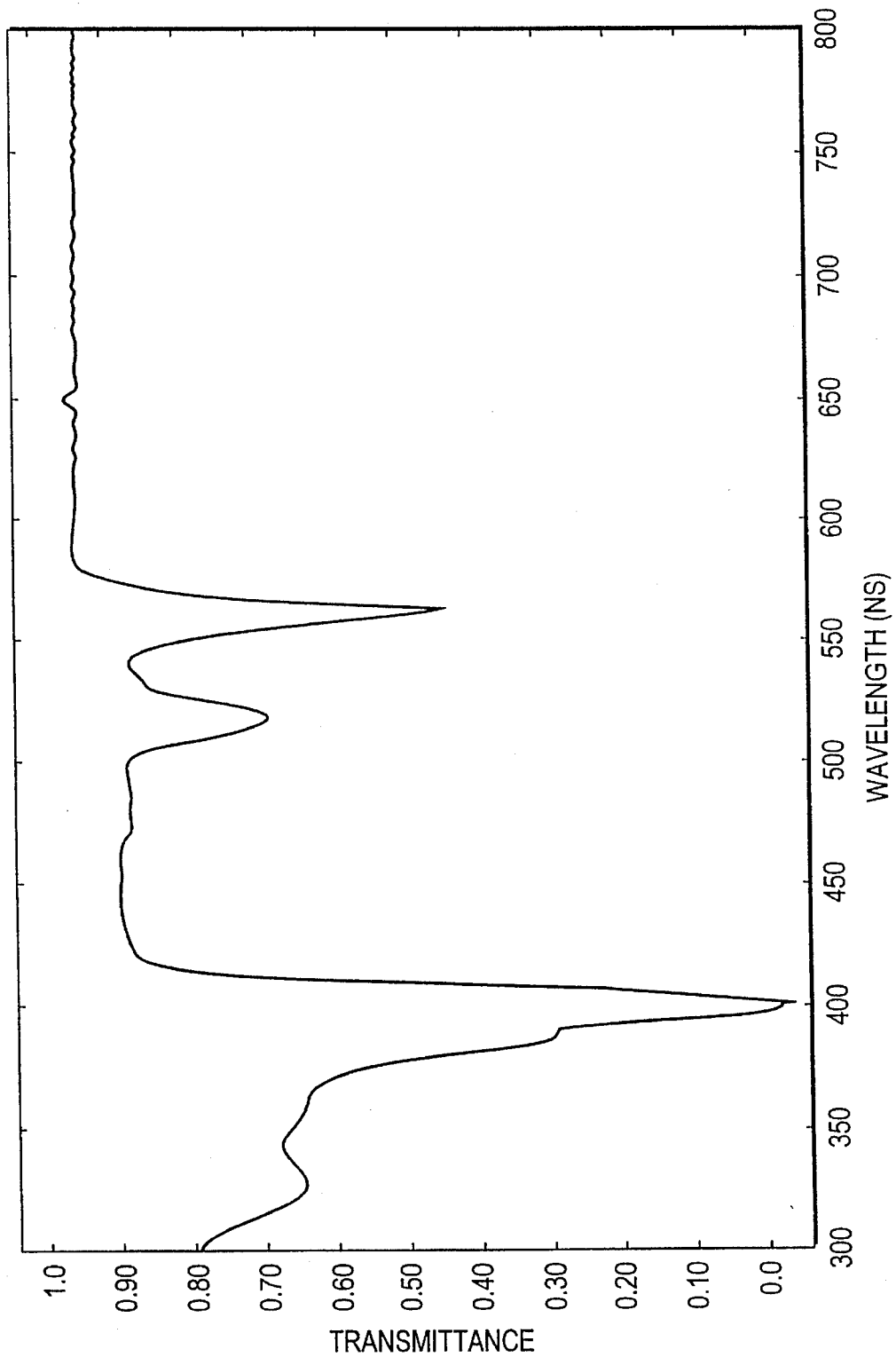
FIG. 13 is a transmission spectrograph of zinc octaethylporphyrin dye.
Figure 14:
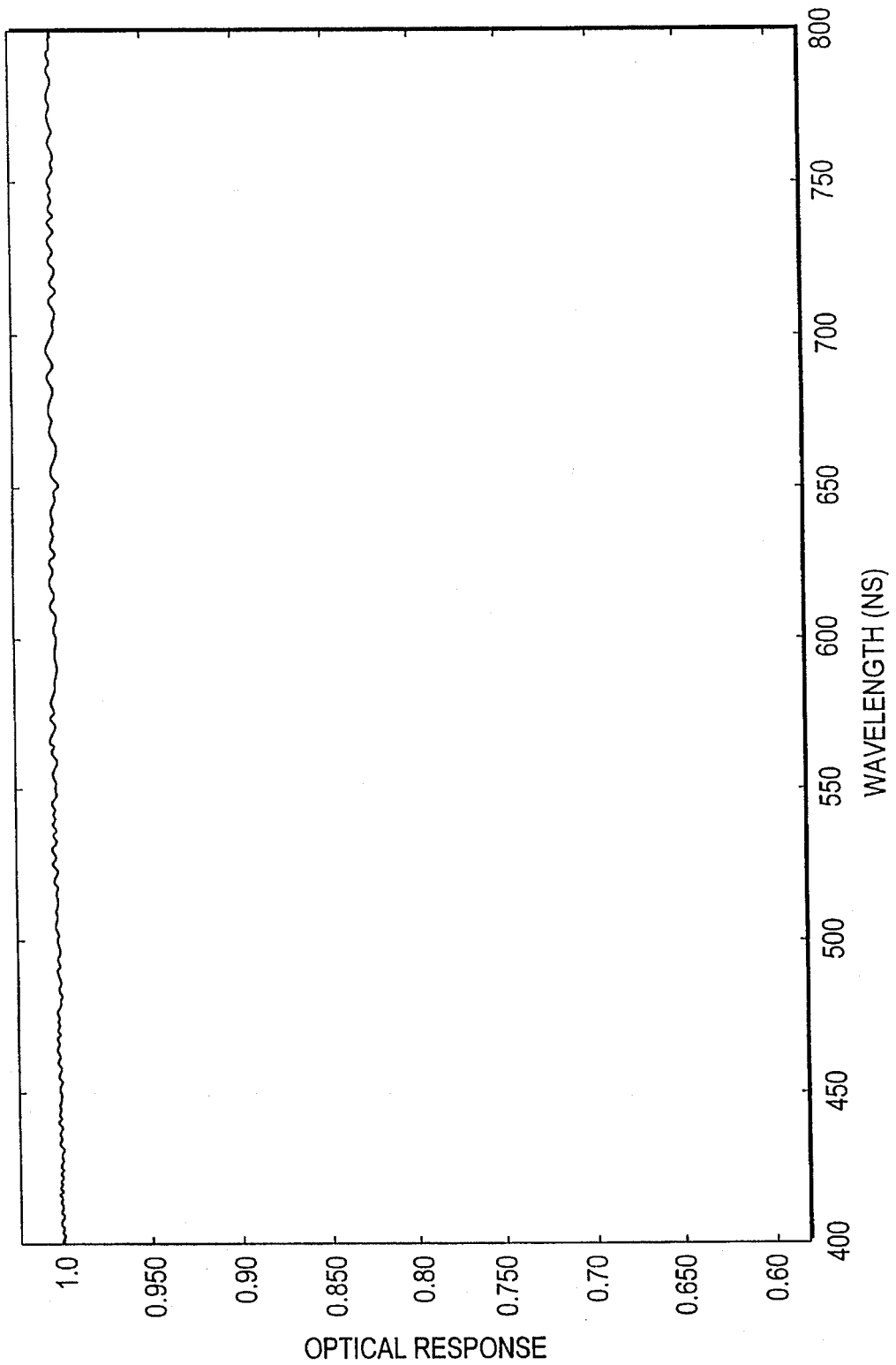
FIG. 14 shows the optical response of a silicon-based photo-detector without a transmission dye layer.
Figure 15:
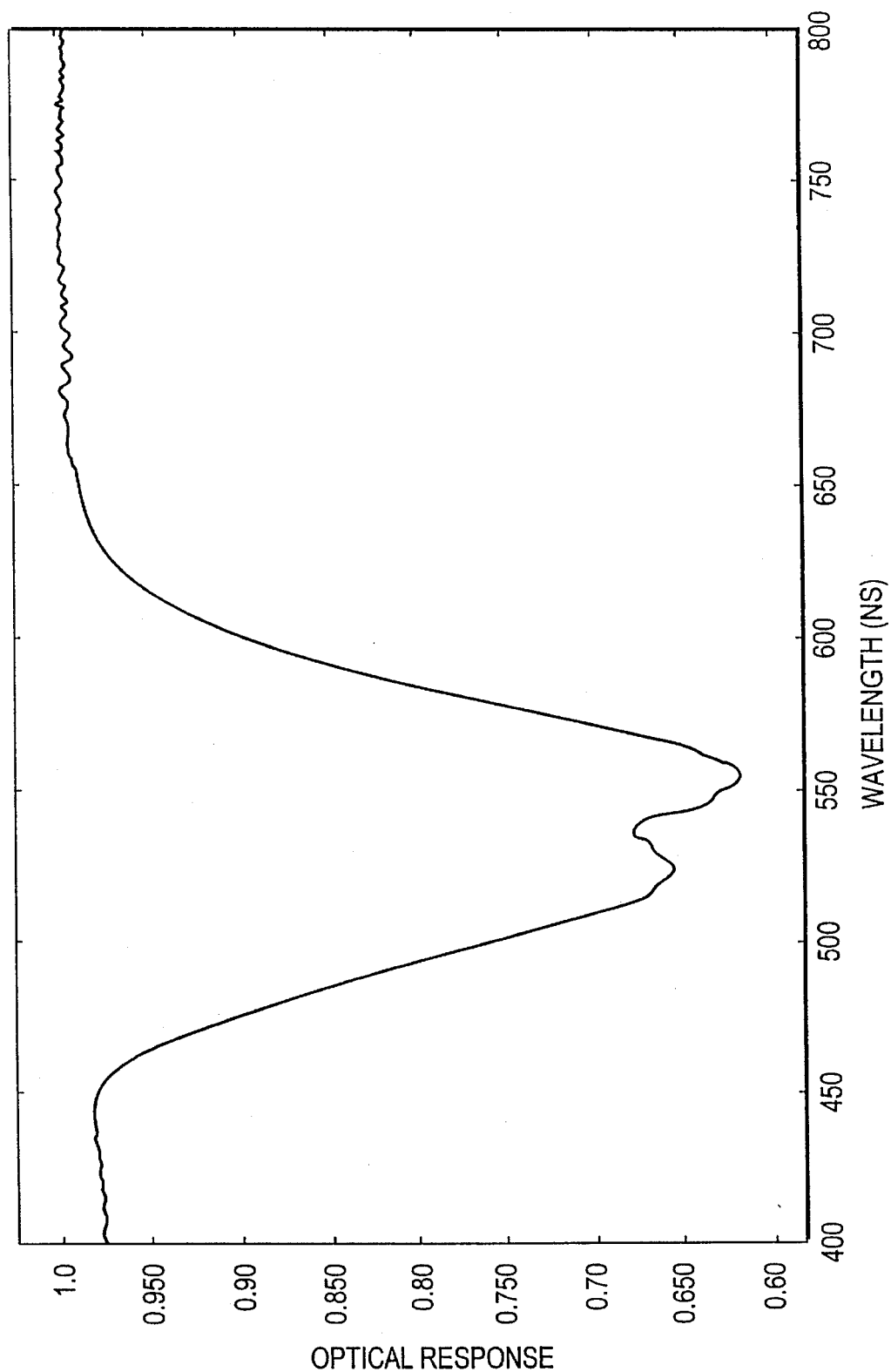
FIG. 15 shows the optical response of a silicon-based photo-detector having a 160Å thick filter of rhodamine 6G dye disposed spaced thereabove.
Figure 16:
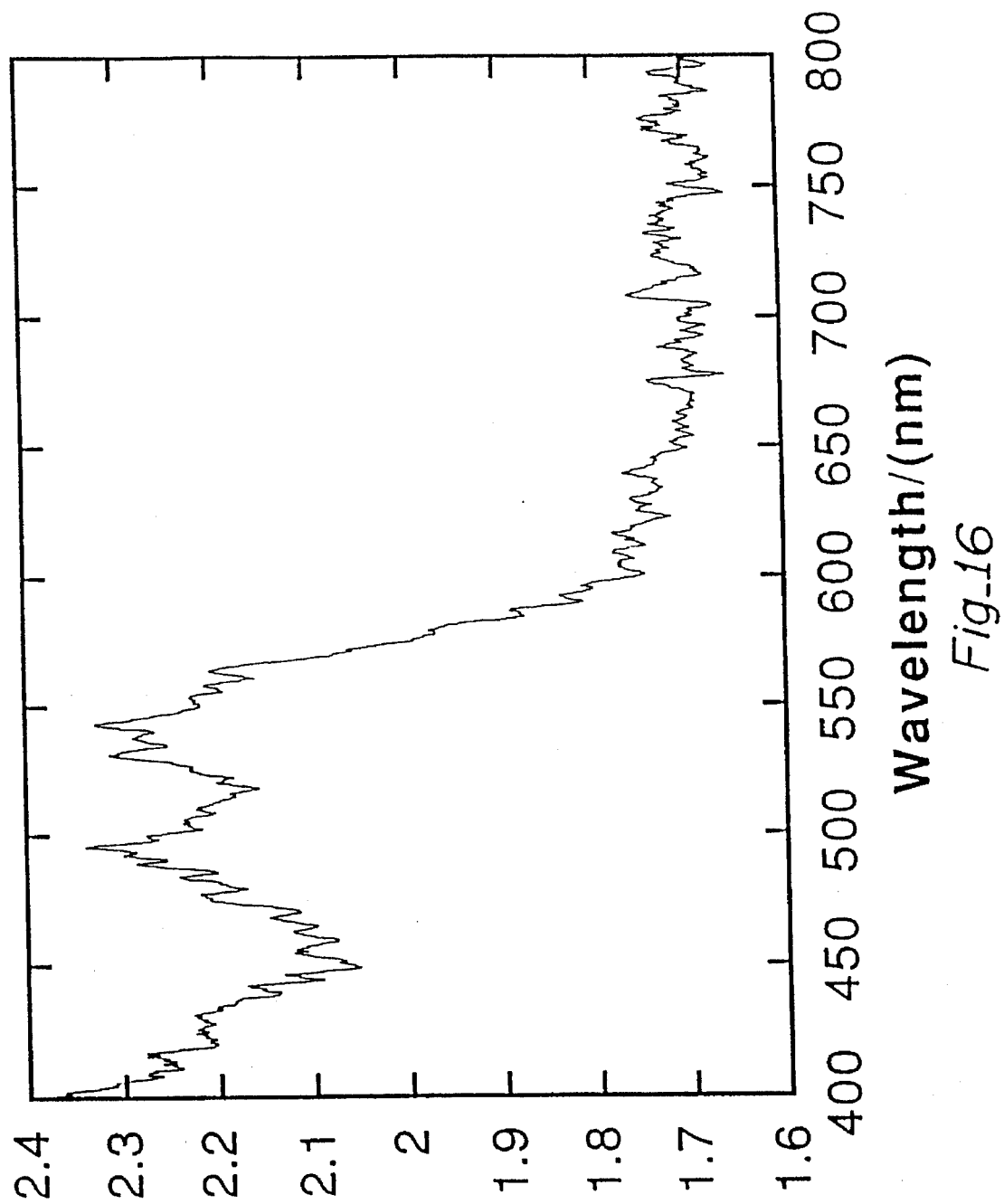
FIG. 16 shows the optical response of an $YBa_2Cu_3O_{7-\delta}$ photodetector coated with a 160Å thick layer of rhodamine 6G dye.

Although octaethylporphyrin does not possess strong absorption bands in the near-infrared portion of the spectra (compare FIGS. 12 and 13), it is closely related to several other macrocyclic ligands which absorb strongly in this spectral region. NIR detection may be accomplished in a fashion similar to that described above by incorporating a molecular dye which absorbs photons efficiently in the near-infrared range. Consequently, a series of dyes which are chemically related to porphyrin systems were investigated. These compounds have the properties of having low chemical reactivity, being resistant to thermal breakdown, and all absorb light very strongly. The closely related macrocycles, phthalocyanine and napthalocyanine were studied as candidate dyes for optical devices of the invention. By studying the solution and the thin film spectra of these dyes (FIGS. 7, 8, 9) taken with an 8450 HP diode array spectrophotometer, we can see that the Sorer band shifts from being centered around 400 nm for octaethylporphyrin to 650 nm for phthalocyanine, and to around 725 nm for naphthalocyanine. These spectral features are fairly sharp and well resolved for the solution spectra (OEP in hexane, the other two dye systems in 1-chloronapthalene), but tend to broaden in the thin film spectra (sublimed on a glass slide) due to intermolecular interactions in the solid state. However, with the increase in peak width there is also a bathochromic shift in the absorption maxima which extends into the near-IR for naphthalocyanine (FIG. 9). Metal substitutions and peripheral derivatizations also can cause shifts in the absorption peaks toward the near-infrared. Thus hybrid molecular dye/ superconductor photodetector devices can operate in the near-infrared range utilizing naphthalocyanines or related macrocyclic dyes.

As shown in FIG. 10, the phthalocyanine dye layer does cause an increase in optical response which is enhanced in the regions in which the phthalocyanine dye absorbs strongly. FIG. 10 shows the optical response vs. wavelength of a 3 mm×50 µm YBCO microbridge coated with 300 nm (3000 Å) thick film of phthalocyanine operating at just below $T_{c(mid)}$. The response was obtained from normalized optical signal of the dye-superconductor device with the uncoated junction response subtracted.

EXAMPLE 6

Figure 17:
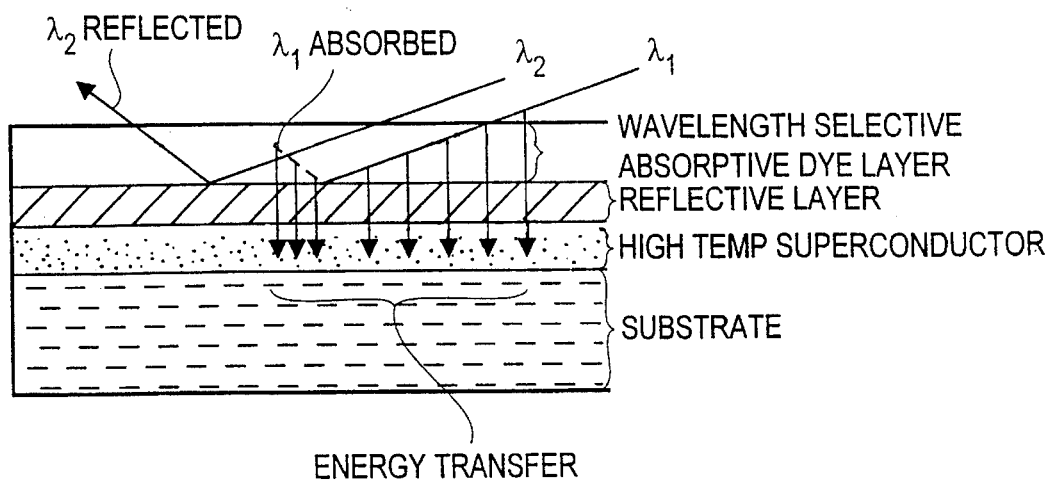
FIG. 17 illustrates in schematic section the preferred best mode of the invention of FIG. 6 employing a reflective layer between the dye and superconductor.
Figure 18:
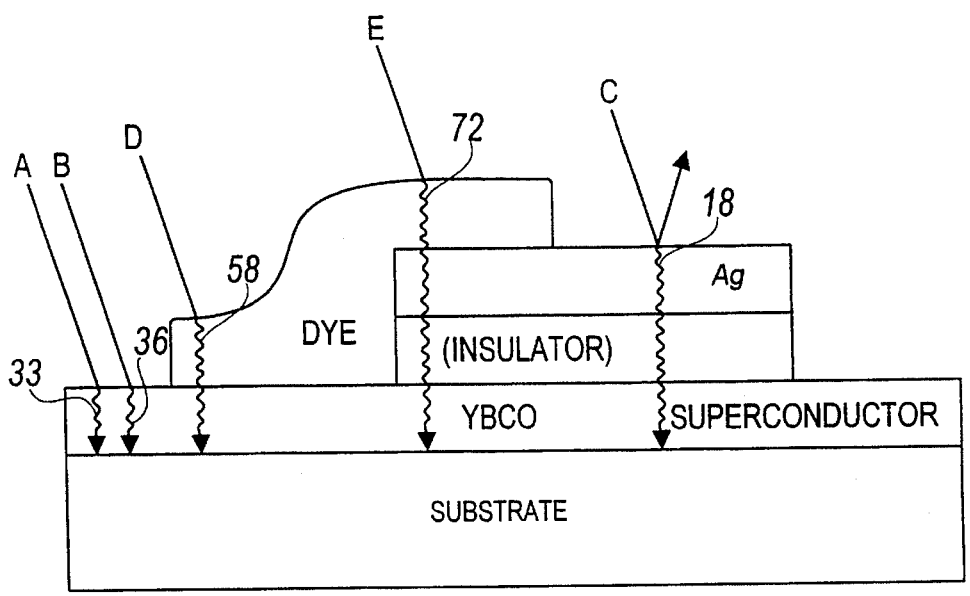
FIG. 18 illustrates in schematic section the layout of the comparative tests of FIG. 6 and Table 1.

This example demonstrates the radical extent to which the energy conversion and conductance mechanism of the dye antenna of this invention differs from the convention light transmission filter mechanisms of the background art. As schematically illustrated in FIG. 18, a long superconductor microbridge element was prepared and selected regions thereon were coated with silver (1200Å), dye (14,000Å) and overlapping (overlying, multilayer) dye/silver layers (14,000Å/1200Å). Any reflecting material may be used to provide the reflective layer including but not limited to metals (silver, aluminum, platinum, palladium, chromium, etc.), group III, group V, and group VI elements and combinations thereof. Data provided in Table 1 reveals the relative optical responsivities of each region, Tests A–E, using a 1 mW He/Ne laser. For comparison purposes, bare regions of the bridge, Tests A and B, were also interrogated (scanned). Test C shows the silver layer alone functions as a mirror to reflect a large portion of the light leading to a decreased response, approximately one-half relative to the uncoated controls. Test D shows the dye layer alone serves to enhance the response, 33–36 µV versus 58 µV, relative to the uncoated controls, due to the above mentioned antenna effect. To underscore the antenna effect, the thickness of the dye utilized here (14,000Å) is so large that the layer is optically opaque. Test E, surprisingly, shows that in the region where the dye overlies the reflective, a further increase in the responsivity is noted resulting in a greater than 2-fold responsivity response (33–36 µV versus 72 µV). In this example, light energy absorbed by the dye antenna is converted and conducted through the dye layer to the silver layer. It is able to couple through the silver layer and down into the superconductor. The thin film superconductor photo-detector embodiment employing the combination of the reflective film and the absorbing dye (illustrated in FIG. 17) represents the present, best, preferred embodiment.

In control experiments using the geometry of Fukaya et al., a decrease in response is obtained whenever a silver layer is utilized. Here, silver acts as a mirror and reflects all colors of light away from the silicon detector. This interaction leads to a decrease in the magnitude of the response independent of whether additional dye filter layers are present.

TABLE 1

| | Optical Response Characteristics | |
|---|---|---|
| TEST | Light Sensing Element | Response (µV) |
| A | Bare superconductor element #A | 33 |
| B | Bare superconductor element #B | 36 |
| C | Superconductor coated with 1200 Å of silver | 18 |
| D | Superconductor coated with 14,000 Å of H2-OEP dye ** | 58 |
| E | superconductor coated with 1200 Å of silver & 14,000 Å of H2-OEP dye | 72 |

** Dye layer is opaque

FIG. 11 shows a schematic of an array of hybrid dye/ superconductor elements for decoding a multiplexed light signal.

In FIG. 11a, a plurality of light sources 51, 52, 53 emitting light of wavelengths $\lambda_1$, $\lambda_2$ and $\lambda_3$, respectively, are controlled by computer or microprocessor controller 34, each with its own modulated signal which is then focused by lens 55 onto fiberoptic cable 57 which transmits polychromatic light to a distant receiving end 58. Alternately or additionally, the controller 34 can operate chopper control 30 to control choppers 128, 228, 328, shown schematically as scissors. At the receiving end, polychromatic light 60 bathes an array of hybrid dye-superconductor elements 100 in cryostat 12, each of which has leads 62 to analyzer 66 via bus 64. As best seen in FIG. 11b, the polychromatic light 60 comprises $\lambda_1+\lambda_2+\lambda_3$ and/or additional wavelengths, which impinges on the hybrid dye-superconductor element (HDSE) array 100 comprising elements 101, 102 and 103. HDSE 101 is coated with a dye layer that absorbs $\lambda_1$, but is essentially transparent to $\lambda_2$ and $\lambda_3$ at the light intensity delivered. Similarly, HDSE 102 is coated with a dye layer that absorbs $\lambda_2$ but is transparent to $\lambda_1$ and $\lambda_3$, and HDSE 103 dye is absorptive to $\lambda_3$ and transparent to $\lambda_1$ and $\lambda_2$. By "essentially transparent" is meant no response, or a response sufficiently different (e.g. lower) that can be distinguished. The individual signals from the elements 101, 102 and 103 are thereby easily distinguishable and processed by amplifier analyzer 66. Thus, a single fiber optic cable can carry multiplexed signals that can be separated at the receiving end. Where amplification of response or redundancy check is desired, more than one element in the array can use the same dye.

It should be understood that various modifications within the scope of this invention can be made by one of ordinary skill in the art without departing from the spirit thereof. For example, recent experiments from our laboratory have shown that thin films of fluorescent dye molecules such as Rhodamine B can transfer energy directly and rapidly to the superconductor via nonthermal routes. In addition, the selection of the intermediate reflecting layer material may be made based upon not only the reflective properties of the material but also on the transmission properties of the material. For example a material that reflects visible light but transmits infrared may be investigated. We therefore wish our invention to be defined by the scope of the appended claims as broadly as the prior art will permit, and in view of the specification if need be.

We claim:

1. A tuneable photo-responsive device comprising in operative combination:

a) a supported thin film superconductor element having a resistance-changeable region defined therein which exhibits a substantially featureless response to a broad band of wavelengths and which has at least one accessible surface area;

b) a coating layer which includes a wavelength selective absorptive dye, or a wavelength selective absorptive dye overlying a photoreflective coating layer, and said coating layer is applied on at least a portion of said surface area of said region;

c) said thin film superconductor element is responsive to energies developed in said absorptive dye-containing coating layer upon exposure to one or more incident wavelengths;

d) said dye has the property of absorbing energy at specified wavelengths corresponding to the discrete energy levels associated with the molecular lattice of said absorptive dye;

e) said specific wavelengths of energy are converted to said discrete molecular lattice energies in said absorptive dye and are conducted to said thin film superconductor to change the resistance value of said superconductor film region to passage of a current therethrough when said superconductor film is maintained near its critical temperature, $T_c$;

f) said reflective layer reflects at least a portion of wavelengths transmitted through said absorptive dye-containing coating layer to shield said thin film superconductor element from said transmitted wavelengths; and g) said dye-containing coating layer acts as an energy harvesting element, which in combination with said superconductor element, forms a hybrid dye/superconductor transducer having wavelength selective enhanced sensitivity as compared to an uncoated superconductive element.

2. A photo-responsive device as in claim 1 which includes:

a) a plurality of said elements disposed in an array, at least some of the surface areas of said regions being coated with at least one different dye-containing layer having different wavelength absorption characteristics; and b) each of said regions to the selective wavelength of the dye in said coating thereon upon exposure to a multiplexed beam of wavelengths impinging thereon.

3. A photo-responsive device in claim 1 wherein said thin film superconductor element includes at least one weak link junction.

4. A photo-responsive device as in claim 3 wherein said superconductive material which forms a portion of said thin film superconductor element comprises a high temperature superconductive material.

5. A photo-responsive device as in claim 3 wherein said superconductive material is selected from the group consisting essentially of cuprate superconductors, bismuth oxide superconductors, elemental superconductors, and binary superconductors.

6. A photo-responsive device as in claim 5 wherein said superconductive material is selected from the group consisting essentially of $La_{2-x}Ba_xCuO_4$ ($0<x<0.4$); $La_{2-x}CuO_4$ ($0<x<0.4$); $RBa_2Cu_3O_{7-\delta}$, where R is $Y^{3+}$, a lathanide, or an actinide ion; $RBa_2Cu_3O_{7-\delta}$ in which $La^{3+}$ or $Sr^{2+}$ are substituted into the $Ba^{2+}$ site, or $Ca^{2+}$ is substituted into the rare earth site and R is the aforesaid; $Bi_2Sr_2CaCu_2O_8$; $Bi_2Sr_2Ca_2Cu_3O_{10}$; $Pb_xBi_{2-x}Sr_2Cu_3O_{10}$ ($0<x<1$); $Tl_2Ba_2Ca_2Cu_3O_{10}$; $Tl_2Ba_2Ca_1Cu_2O_8$; $Nd_{2-x}Ce_xCuO_4$; ($0<x<1$); $Nd_{2-x}Th_xCuO_4$ ($0<x<1$); $K_{1-x}Ba_xBiO_3$ ($0<x<1$); $Rb_{1-x}Ba_xBiO_3$ ($0<x<1$); $BaPb_{1-x}Bi_xO_3$ ($0<x<0.4$); Pb, Sn, Nb, and Hg; $Nb_3Ge$, $Nb_3Sn$, $N_bN$, and PdH; and mixtures or co-compositions thereof.

7. A photo-responsive device as in claim 5 wherein said dye is selected from the group of dyes consisting essentially of macrocyclic, polymethine cyanine, quinone, azo, rhodamine, squaraines, perylene, anthraquinone, polycyclic aromatic carbonyl, polyaryl carbonium, fluorescent, photochromic, electrochromic, photoconductive, polymeric chromophore, and liquid crystalline dyes, and mixtures and cocompositions thereof.

8. A photo-responsive device as in claim 6 wherein said dye is selected from the group of dyes consisting essentially of macrocyclic, polymethine cyanine, quinone, azo, rhodamine, squaraines, perylene, anthraquinone, polycyclic aromatic carbonyl, polyaryl carbonium, fluorescent, photochromic, electrochromic, photoconductive, polymeric chromophore, and liquid crystalline dyes, and mixtures and cocompositions thereof.

9. A photo-responsive device as in claim 1 wherein said dye has a wavelength absorption characteristic in the range of from visible to infrared wavelengths.

10. A photo-responsive device as in claim 9 wherein said superconductive material is selected from the group consisting essentially of cuprate superconductors, bismuth oxide superconductors, elemental superconductors, and binary superconductors.

11. A photo-responsive device as in claim 10 wherein said superconductive material is selected from the group consisting essentially of $La_{2-x}Ba_xCuO_4$ ($0<x<0.4$); $La_{2-x}CuO_4$ ($0<x<0.4$); $RBa_2Cu_3O_{7-\delta}$, where R is $Y^{3+}$, a lathanide, on an actinide ion; $RBa_2Cu_3O_{7-\delta}$ in which $La^{3+}$ or $Sr^{2+}$ are substituted into the $Ba^{2+}$ site, or $Ca^{2+}$ is substituted into the rare earth site and R is the aforesaid; $Bi_2Sr_2CaCu_2O_8$; $Bi_2Sr_2Ca_2Cu_3O_{10}$; $Pb_xBi_{2-x}Sr_2Cu_3O_{10}$ ($0<x<1$); $Tl_2Ba_2Ca_2Cu_3O_{10}$; $Tl_2Ba_2Ca_1Cu_2O_8$; $Nd_{2-x}Ce_xCuO_4$; ($0<x<1$); $Nd_{2-x}Th_xCuO_4$; ($0<x<1$); $K_{1-x}Ba_xBiO_3$ ($0<x<1$); $Rb_{1-x}Ba_xBiO_3$ ($0<x<1$); $BaPb_{1-x}Bi_xO_3$ ($0<x<0.4$); Pb, Sn, Nb, and Hg; $Nb_3Ge$, $Nb_3Sn$, $N_bN$, and PdH; and mixtures or co-compositions thereof.

12. A photo-responsive device as in claim 10 wherein said dye is selected from the group of dyes consisting essentially of macrocyclic, polymethine cyanine, quinone, azo, rhodamine, squaraines, perylene, anthraquinone, polycyclic aromatic carbonyl, polyaryl carbonium, fluorescent, photochromic, electrochromic, photoconductive, polymeric chromophore, and liquid crystalline dyes, and mixtures and cocompositions thereof.

13. A photo-responsive device as in claim 11 wherein said dye is selected from the group of dyes consisting essentially of macrocyclic, polymethine cyanine, quinone, azo, rhodamine, squaraines, perylene, anthraquinone, polycyclic aromatic carbonyl, polyaryl carbonium, fluorescent, photochromic, electrochromic, photoconductive, polymeric chromophore, and liquid crystalline dyes, and mixtures and cocompositions thereof.

14. A photo-responsive device as in claim 6 wherein said dye is selected from a porphyrin compound, a cyanine compound, a rhodamine compound, derivatives of said porphyrin, cyanine, and rhodamine compounds, metal-ion complexes of said porphyrin, cyanine and rhodamine compounds, and mixtures thereof.

15. A method of decoding a multiplexed wavelength-containing signal comprising the steps in operative sequence of:
   a) arraying a plurality of supported thin film superconductor elements having a resistance-changeable region defined therein, and least one accessible surface area on which surface area a coating is disposed on at least a portion of said surface area of said region;
   b) said coating includes a wavelength selective absorptive dye, or a wavelength selective absorptive dye overlying a photo-reflective layer, and said dye has the property of absorbing energy at specific wavelengths corresponding to the discrete energy levels associated with the molecular lattice of said absorptive dye; and
   c) said specific wavelengths of energy are converted to said discrete molecular lattice energies in said absorptive dye and are conducted to said thin film superconductor to change the resistance value of said superconductive film region to a passage of a current therethrough when said superconductor film is maintained near its critical temperature, $T_c$;
   d) exposing said array of said elements to a multiplexed signal beam including at least two information-encoded wavelengths;
   e) sensing changes in the resistance of at least some of the regions of said elements;
   f) processing said sensed resistance changes to selectively decode individual signals of encoded information from among said at least two beams of information-encoded in said multiplexed beam; and
   g) said reflective layer reflects at least a portion of wavelengths transmitted through said absorptive dye-containing layer to shield said thin film superconductor element from said transmitted wavelengths.

16. A method of decoding a multiplexed wavelength-containing signal in claim 15 wherein:
   a) said multiplexed signal includes a plurality of modulated different wavelengths $\lambda_1, \lambda_2, \ldots \lambda_n$.

17. A method of decoding a multiplexed wavelength-containing signal as in claim 15 wherein:
   a) said information encoding includes modulating the intensity of said beams; and
   b) transmitting said multiplexed signal.

18. A method of decoding a multiplexed wavelength-containing signal as in claim 15 wherein:
   a) said information encoding includes forming pulses in said beam; and
   b) transmitting said multiplexed signal.

19. A method of photosensing comprising the steps in operative sequence of:
   a) providing a supported thin-film superconductor element having a resistive-changeable region defined therein and having at least one accessible surface area on which surface area a wavelength-selective absorptive coating is disposed on at least a portion thereof;
   b) said coating includes a light absorptive dye, or a light absorptive dye overlying a photoreflective layer, said light absorptive dye having the property of absorbing light energy at least one specific wavelength corresponding to at least one substantially discrete energy level associated with the molecular lattice of said absorptive dye;
   c) said specific wavelengths of light energy are converted to said discrete molecular lattice energies in said light absorptive dye and are conducted to said thin film superconductor to change the resistance value of said superconductive film region to a passage of current therethrough when said superconductor film is maintained near its critical temperature, $T_c$;
   d) maintaining said element near its critical temperature, $T_c$;
   e) exposing said dye coated surface area portion of element to light having at least one wavelength absorbable by said dye;
   f) maintaining said light exposure for a time sufficient to change the resistance value of said region by a detectible value; and
   g) detecting said change of resistance value; and
   h) said reflective layer reflects at least a portion of light frequencies transmitted through said light absorptive dye-containing layer to shield said thin film superconductor element from said transmitted light.

20. A method of photosensing as in claim 19 wherein:
   a) said dye is absorptive in at least one wavelength in the spectrum of from visible to infrared wavelengths.

* * * * *